United States Patent
Nagami

(10) Patent No.: US 9,805,917 B2
(45) Date of Patent: Oct. 31, 2017

(54) PLASMA PROCESSING METHOD

(71) Applicant: Tokyo Electron Limited, Tokyo (JP)

(72) Inventor: Koichi Nagami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/408,733

(22) Filed: Jan. 18, 2017

(65) Prior Publication Data

US 2017/0207068 A1 Jul. 20, 2017

(30) Foreign Application Priority Data

Jan. 19, 2016 (JP) .................. 2016-008143

(51) Int. Cl.
*H01J 37/32* (2006.01)
(52) U.S. Cl.
CPC .. *H01J 37/32449* (2013.01); *H01J 37/32183* (2013.01)
(58) Field of Classification Search
CPC ............... H01J 37/32; H01J 37/32183; H01J 37/32165; H01J 37/32449; H01J 37/3244; H01J 37/32091
See application file for complete search history.

(56) References Cited

U.S. PATENT DOCUMENTS

| | | | | |
|---|---|---|---|---|
| 2004/0116080 A1* | 6/2004 | Chen | ............... | G01R 19/0061 455/115.1 |
| 2006/0220574 A1* | 10/2006 | Ogawa | ............... | H01J 37/32082 315/111.21 |
| 2009/0255800 A1* | 10/2009 | Koshimizu | ....... | H01J 37/32165 204/164 |
| 2009/0297404 A1* | 12/2009 | Shannon | ........... | H01J 37/32082 422/108 |
| 2012/0052689 A1* | 3/2012 | Tokashiki | ......... | H01J 37/32091 438/714 |
| 2013/0214828 A1* | 8/2013 | Valcore, Jr. | ....... | H01J 37/32146 327/141 |
| 2016/0133530 A1* | 5/2016 | Sonoda | ............... | H01L 21/3065 438/10 |

FOREIGN PATENT DOCUMENTS

JP 2013-058749 A 3/2013

* cited by examiner

*Primary Examiner* — Thai Pham
(74) *Attorney, Agent, or Firm* — Pearne & Gordon LLP

(57) ABSTRACT

In a plasma processing method, first processes and second processes are performed alternately. In each first process, a first gas is supplied into a processing vessel from a gas supply system, and a first high frequency power is supplied from a first high frequency power supply. In each second process, the first high frequency power is supplied from the first high frequency power supply continuously from a first process which is performed just before the corresponding second process. In each second process, a gas switching signal for switching the gas from the first gas to the second gas is applied to the gas supply system. Further, a supply of a second high frequency power is begun by a second high frequency power supply when a parameter such as a load impedance exceeds a threshold value after the gas switching signal is applied to the gas supply system.

5 Claims, 12 Drawing Sheets

PLASMA PROCESSING METHOD

CROSS-REFERENCE TO RELATED APPLICATION

This application claims the benefit of Japanese Patent Application No. 2016-008143 filed on Jan. 19, 2016, the entire disclosures of which are incorporated herein by reference.

TECHNICAL FIELD

The embodiments described herein pertain generally to a plasma processing method performed by a plasma processing apparatus for processing a processing target object.

BACKGROUND

In the manufacture of an electronic device such as a semiconductor device, a plasma processing is performed on a processing target object by a plasma processing apparatus. Generally, the plasma processing apparatus includes a processing vessel, a gas supply system, a first electrode, a second electrode, a first high frequency power supply and a second high frequency power supply. The gas supply system is configured to supply a gas into the processing vessel. The first electrode and the second electrode are disposed such that a space within the processing vessel is provided therebetween. The first high frequency power supply is configured to supply a first high frequency power for plasma generation to the first electrode or the second electrode, and the second high frequency power supply is configured to supply a second high frequency power having a relatively low frequency for ion attraction to the second electrode. Generally, in the plasma processing performed in this plasma processing apparatus, the gas is supplied into the processing vessel from the gas supply system, and the first high frequency power from the first high frequency power supply is supplied to the first electrode or the second electrode to generate plasma. The second high frequency power from the second high frequency power supply is supplied to the second electrode when necessary.

There is a plasma processing in which a first process of generating plasma of a first gas and a second process of generating plasma of a second gas are performed alternately. That is, in this plasma processing, the first gas and the second gas are supplied into the processing vessel alternately, and a first high frequency power is supplied to the first electrode or the second electrode over the first process and the second process to generate plasma. Further, the second high frequency power may be supplied to the second electrode in the second process without being supplied in the first process.

Since a gas has a mass, it takes time for the second gas to actually reach the processing vessel from a time when the gas supply system is controlled to switch the gas supplied into the processing vessel from the first gas to the second gas. Meanwhile, the second high frequency power is supplied to the second electrode in a negligible time length after the second high frequency power supply is controlled to supply the second high frequency power. Accordingly, it may happen that the second high frequency power is supplied to the second electrode at a time when the second gas does not reach the inside of the processing vessel.

In this regard, there is proposed a technique of starting the supply of the second high frequency power after it is determined from a detection result of an emission spectrum within the processing vessel that the second gas has reached the inside of the processing vessel. This technique is described in Patent Document 1.

Patent Document 1: Japanese Patent Laid-open Publication No. 2013-058749

There may be no detectable difference between an emission spectrum of the plasma of the first gas and an emission spectrum of the plasma of the second gas. For example, depending on the kind of a gas contained in the first gas and the kind of a gas contained in the second gas, there may be no detectible difference between the emission spectrum of the plasma of the first gas and the emission spectrum of the plasma of the second gas. In case that there is no detectible discrepancy between the emission spectrums of the plasma of the first gas and the plasma of the second gas, the timing when the second gas has reached the inside of the processing vessel cannot be detected with high accuracy. Resultantly, the supply of the second high frequency power cannot be begun at an appropriate timing.

Therefore, there arises a demand for a technique of accurately detecting the timing when the second gas has reached the inside of the processing vessel in the plasma processing in which the first process of generating the plasma of the first gas within the processing vessel of the plasma processing apparatus and the second process of generating the plasma of the second gas within the corresponding processing vessel are performed alternately.

SUMMARY

In one exemplary embodiment, there is provided a plasma processing method performed in a plasma processing apparatus. The plasma processing apparatus includes a processing vessel, a gas supply system, a first electrode, a second electrode, a first high frequency power supply, a second high frequency power supply, a first power feed line, a second power feed line, a first matching device, a second matching device, a first device and a second device. The gas supply system is configured to supply a gas into the processing vessel. The first electrode and the second electrode are arranged such that a space within the processing vessel is provided therebetween. The first high frequency power supply is configured to output a first high frequency power for plasma generation. The second high frequency power supply is configured to output a second high frequency power for ion attraction. The first power feed line is configured to connect the first high frequency power supply to the first electrode or the second electrode. The second power feed line is configured to connect the second high frequency power supply to the second electrode. The first matching device is configured to adjust a load impedance of the first high frequency power supply. The second matching device is configured to adjust a load impedance of the second high frequency power supply. The first device is configured to control the gas supply system. The second device is configured to obtain a parameter which includes at least one of the load impedance, a load resistance and a load reactance of the first high frequency power supply, and a reflection wave coefficient of the first high frequency power.

The plasma processing method includes first processes and the second processes performed alternately with the first processes. In each of the first processes, plasma of a first gas is generated within the processing vessel. In each of the second processes, plasma of a second gas which contains a gas different from a gas contained in the first gas is generated within the processing vessel. In each of the first processes, the first gas is supplied into the processing vessel from the gas supply system, and the first high frequency power is supplied to the first electrode or the second electrode from the first high frequency power supply. In each of the second processes, the first high frequency power is supplied to the first electrode or the second electrode from the first high frequency power supply continuously from a first process, which is performed just before the corresponding second process, among the first processes. Each of the second processes includes applying a gas switching signal to the gas supply system from the first device to switch a gas to be supplied into the processing vessel from the first gas to the second gas; and instructing, by the second device, the second high frequency power supply to start a supply of the second high frequency power to the second electrode when the parameter exceeds a threshold value after the gas switching signal is applied to the gas supply system.

If the gas that exists within the processing vessel is switched from the first gas to the second gas in the state that the supply of the first high frequency power is continued, the impedance of the plasma generated within the processing vessel is changed. Since the aforementioned parameter is varied according to the impedance of the plasma, this parameter well reflects a change of the gas that exists within the processing vessel. In the plasma processing method according to the exemplary embodiment, the reach of the second gas at the inside of the processing vessel is detected based on this parameter. Therefore, a timing when the second gas has reached the inside of the processing vessel can be detected with high accuracy. Further, since the supply of the second high frequency power is begun at the moment when the reach of the second gas is detected, the supply of the second high frequency power can be started at an appropriate timing.

The plasma processing method may further include obtaining, by a third device of the plasma processing apparatus, a time difference between a time point when each of the second processes is begun and a time point when the supply of the second high frequency power in each of the second processes is begun; and adjusting a set processing time length of a subsequent second process, which is performed later than a completed second process, such that the set processing time length of the subsequent second process is increased by the time difference obtained for the completed second process. In each of the second processes, the processing time length thereof is initially set. Accordingly, if the timing of starting the supply of the second high frequency power is delayed in any one of the second processes, the time length of the plasma processing which is performed in the state that the second high frequency power is supplied to the second electrode in this corresponding second process is shortened. However, according to the present exemplary embodiment, the processing time length of the subsequent second process performed later is increased from the initially set processing time length as much as the time difference which is obtained for the completed second process performed before. Therefore, the total processing time length of the processing by the plasma of the second gas which is performed in the state that the second high frequency power is supplied to the second electrode can be maintained substantially constant.

The plasma processing method may further include adjusting, by the second device, the threshold value by using a moving average value calculated from series of the parameter. Here, the series of the parameter include a parameter including at least one of the load impedance, the load resistance and the load reactance of the first high frequency power supply and the reflection wave coefficient of the first high frequency power in a state that impedance matching by the first matching device is completed in the completed second process among the second processes, or in each of the completed second process and a second process being performed. In the state that the impedance matching by the first matching device is completed in the second process, the second gas reaches the inside of the processing vessel sufficiently. Thus, by adjusting the threshold value with the moving average value of the series of the parameter in this state, the timing when the second gas has reached the inside of the processing vessel is detected with higher accuracy.

The plasma processing method may further include (i) controlling, by a power supply controller of the first high frequency power supply, the first high frequency power when a first moving average value and a second moving average value fall within a preset control range in each of the second processes, a frequency of the first high frequency power output in a first sub-period being adjusted such that the load impedance of the first high frequency power supply estimated from the first moving average value approximates to an output impedance of the first high frequency power supply, and the frequency of the first high frequency power output in a second sub-period being adjusted such that the load impedance of the first high frequency power supply estimated from the second moving average value approximates to the output impedance of the first high frequency power supply; and (ii) controlling, by a power supply controller of the second high frequency power supply, the second high frequency power when a third moving average value and a fourth moving average value fall within a predetermined control range in each of the second processes, a frequency of the second high frequency power output in the first sub-period being adjusted such that a load impedance of the second high frequency power supply estimated from the third moving average value approximates to an output impedance of the second high frequency power supply, and the frequency of the second high frequency power output in the second sub-period being adjusted such that the load impedance of the second high frequency power supply estimated from the fourth moving average value approximates to the output impedance of the second high frequency power supply. Here, the first sub-period is a period, within a processing time of each of the second processes, ranging from a time point when a supply of the second high frequency power is begun to a preset time point within the processing time, and the second sub-period is a period ranging from the preset time point to an end time point of the processing time. The first moving average value is a moving average value of the load impedance of the first high frequency power supply in the first sub-period, within each of the processing times of the completed second processes among the second processes, ranging from the time point when the supply of the second high frequency power is begun to the preset time point within the processing time. The second moving average value is a moving average value of the load impedance of the first high frequency power supply in the second sub-period, within each of the processing times of the completed second processes, ranging from the preset time point to the end time point of the processing time. The third moving average value is a moving average value of the load impedance of the second high frequency power supply in the first sub-period within each of the processing times of the completed second processes. The fourth moving average value is a moving average value of the load impedance of the second high frequency power supply in the second sub-period within each of the processing times of the completed second processes.

In the period ranging from the time point when the supply of the second high frequency power is begun in the second process to the preset time point within the processing time of the second process, that is, the first sub-period, the reflection wave on the first power feed line may be increased than the reflection wave in the second sub-period, which is after the first sub-period. This is caused by the variation of the load impedance of the first high frequency power supply. Further, this is the same for the second high frequency power. Thus, in order to reduce the reflection wave of the first high frequency power, it is required to match the load impedance of the first high frequency power supply in each of the first sub-period and the second sub-period individually with an output impedance of the first high frequency power supply. Further, in order to reduce the reflection wave of the second high frequency power, it is required to match the load impedance of the second high frequency power supply in each of the first sub-period and the second sub-period individually with the output impedance of the second high frequency power supply. According to the present exemplary embodiment, the frequency of the first high frequency power is adjusted such that the load impedance of the first high frequency power supply estimated from the moving average value (i.e., first moving average value) of the load impedance of the first high frequency power supply in the first sub-period of the completed second process approximates to the output impedance of the first high frequency power supply. Further, the frequency of the first high frequency power in the second sub-period is adjusted in the same manner based on the second moving average value. Furthermore, the frequency of the second high frequency power in the first sub-period is adjusted in the same manner based on the third moving average value. In addition, the frequency of the second high frequency power in the second sub-period is adjusted in the same manner based on the fourth moving average value. Since the first high frequency power supply and the second high frequency power supply can change the frequencies of the high frequency powers at a high speed, it is possible to perform the impedance matching while keeping up with the variation of the load impedance at a high speed.

In the controlling of the first high frequency power, the power supply controller of the first high frequency power supply may adjust a power of the first high frequency power such that the power of the first high frequency power in the first sub-period is higher than that of the first high frequency power in the second sub-period. Further, in the controlling of the second high frequency power, the power supply controller of the second high frequency power supply may adjust a power of the second high frequency power such that the power of the second high frequency power in the first sub-period is higher than that of the second high frequency power in the second sub-period. The power of the high frequency power can be additionally supplied when the power of the high frequency power combined to the plasma in the first sub-period is not sufficient.

According to the exemplary embodiment as stated above, it is possible to detect the timing when the second gas has reached the inside of the processing vessel in the plasma processing in which the first processes of generating the plasma of the first gas and the second processes of generating the plasma of the second gas are performed alternately in the processing vessel of the plasma processing apparatus.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
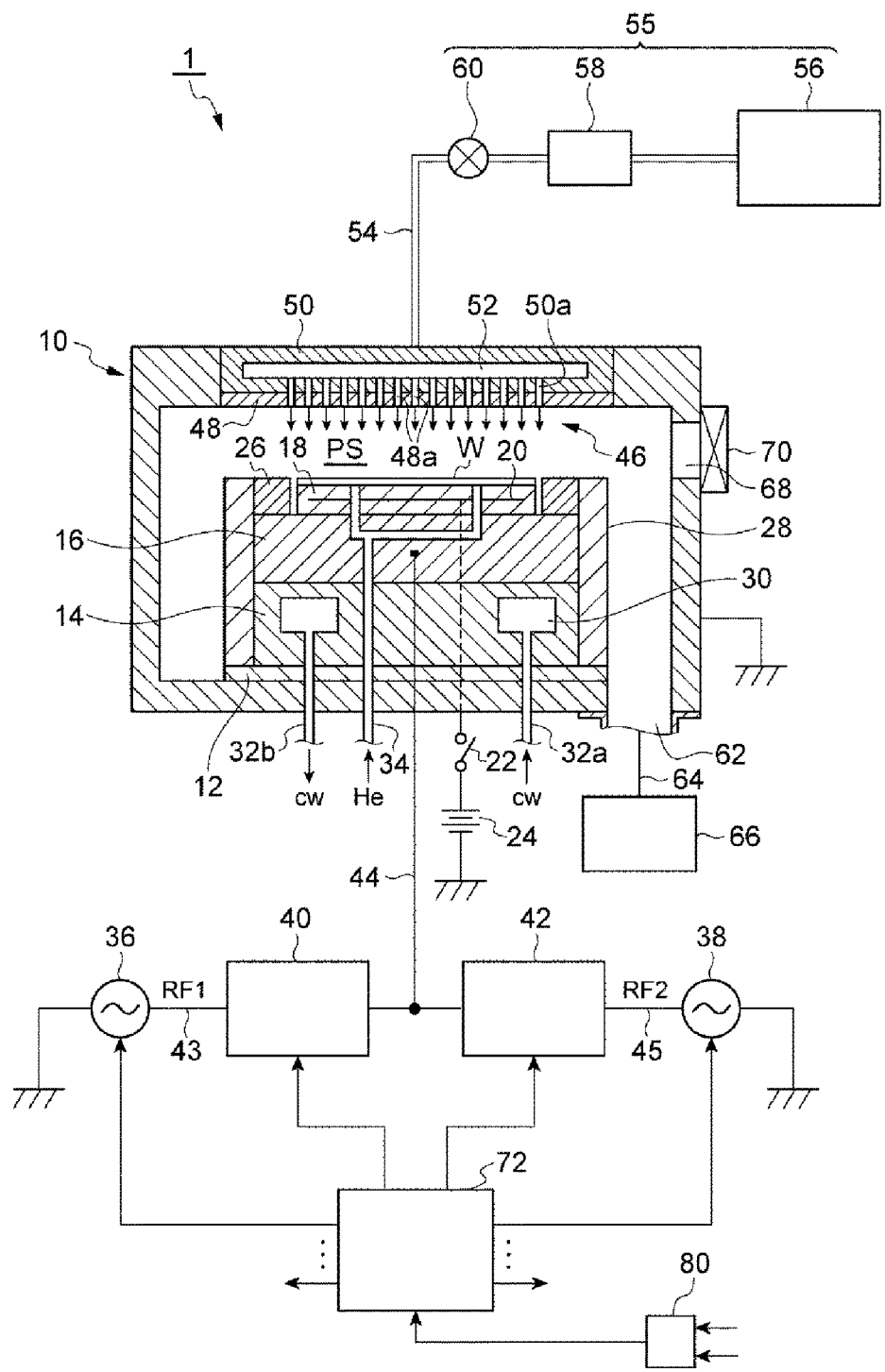
FIG. 1 is a diagram schematically illustrating a configuration of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a plasma processing apparatus capable of performing a plasma processing method according to an exemplary embodiment will be described. FIG. 1 is a diagram schematically illustrating a configuration of a plasma processing apparatus according to an exemplary embodiment. The plasma processing apparatus 1 shown in FIG. 1 is configured as a capacitively coupled plasma processing apparatus. The plasma processing apparatus 1 includes a processing vessel 10. The processing vessel 10 has a substantially cylindrical shape, and is made of a material such as aluminum. An inner wall surface of the processing vessel 10 is anodically oxidized. The processing vessel 10 is grounded.

An insulating plate 12 is provided at a bottom portion of the processing vessel 10. The insulating plate 12 is made of, by way of non-limiting example, ceramic. A supporting table 14 is provided on the insulating plate 12. The supporting table 14 has a substantially circular column shape, and a susceptor 16 is provided on the supporting table 14. The susceptor 16 is made of a conductive material such as aluminum, and is configured as a lower electrode (second electrode).

An electrostatic chuck 18 is provided on the susceptor 16. The electrostatic chuck 18 has a structure in which an electrode 20 made of a conductive film is embedded between insulating layers or between insulating sheets. The electrode 20 of the electrostatic chuck 18 is electrically connected to a DC power supply 24 via a switch 22. The electrostatic chuck 18 is configured to generate an electrostatic attracting force by a DC voltage applied from the DC power supply 24, and hold a processing target object W thereon by this electrostatic attracting force. The processing target object W is a disk-shaped object such as a wafer. A focus ring 26 is disposed on the susceptor 16 to surround the electrostatic chuck 18. Further, a cylindrical inner wall member 28 is disposed on side surfaces of the susceptor 16 and the supporting table 14. This inner wall member 28 is made of, but not limited to, quartz.

A coolant path 30 is formed within the supporting table 14. For example, the coolant path 30 is extended in a spiral shape around a central axis line which is extended in a vertical direction. A coolant cw (for example, cooling water) is supplied through a pipeline 32a into the coolant path 30 from a chiller unit provided at the outside of the processing vessel 10. The coolant supplied into the coolant path 30 is then returned back into the chiller unit via a pipeline 32b. By adjusting a temperature of the coolant through the chiller unit, a temperature of the processing target object W can be adjusted. Further, in the plasma processing apparatus 1, a heat transfer gas (e.g., a He gas) supplied through a gas supply line 34 is introduced into a gap between a top surface of the electrostatic chuck 18 and a rear surface of the processing target object W.

A conductor 44 (e.g., a power feed rod) is connected to the susceptor 16. A high frequency power supply 36, i.e., a first high frequency power supply is connected to the conductor 44 via a matching device 40, i.e., a first matching device, and a high frequency power supply 38, i.e., a second high frequency power supply is also connected to this conductor 44 via a matching device 42, i.e., a second matching device. The high frequency power supply 36 is configured to output a high frequency power RF1 for plasma generation, i.e., a first high frequency power. A basic frequency $f_{B1}$ of the high frequency power RF1 output from the high frequency power supply 36 is, for example, 100 MHz. The high frequency power supply 38 is configured to output a high frequency power RF2 for attracting ions from plasma into the processing target object W, i.e., a second high frequency power. A basic frequency $f_{B2}$ of the high frequency power RF2 output from the high frequency power supply 38 is, for example, 13.56 MHz.

The matching device 40 and the conductor 44 constitute a part of a power feed line 43, i.e., a first power feed line, which is configured to transmit the high frequency power RF1 from the high frequency power supply 36 to the susceptor 16. Further, the matching device 42 and the conductor 44 constitute a part of a power feed line 45, i.e., a second power feed line, which is configured to transmit the high frequency power RF2 from the high frequency power supply 38 to the susceptor 16.

An upper electrode 46 is provided at a ceiling portion of the processing vessel 10. A processing space PS in which plasma is generated is formed between the upper electrode 46 and the susceptor 16 within the processing vessel 10. The upper electrode 46 has a ceiling plate 48 and a supporting body 50. The ceiling plate 48 is provided with a multiple number of gas discharge holes 48a. The ceiling plate 48 is made of a silicon-based material such as, but not limited to, Si or SiC. The supporting body 50 is a member which supports the ceiling plate 48 in a detachable manner and is made of aluminium. A surface of the supporting body 50 is anodically oxidized.

A gas buffer room 52 is provided within the supporting body 50. Further, the supporting body 50 is provided with a multiple number of gas through holes 50a. The gas through holes 50a are extended from the gas buffer room 52 and communicated with the gas discharge holes 48a, respectively. The gas buffer room 52 is connected with a gas supply system 55 via a gas supply line 54. The gas supply system 55 includes a gas source group 56, a flow rate controller group 58 and a valve group 60. The gas source group 56 includes a plurality of gas sources. The flow rate controller group 58 includes a multiple number of flow rate controllers. Here, the flow rate controllers may be implemented by, by way of non-limiting example, mass flow controllers. Further, the valve group 60 includes a multiple number of valves. Each of the plurality of gas sources of the gas source group 56 is connected to the gas supply line 54 via each corresponding flow rate controller of the flow rate controller group 58 and each corresponding valve of the valve group 60. The gas supply system 55 is configured to supply a gas from a gas source selected from the plurality of gas sources into the gas buffer room 52 at a controlled flow rate. The gas introduced into the gas buffer room 52 is discharged into the processing space PS through the gas discharge holes 48a.

When viewed from the top, an annular space is formed between the susceptor 16 and a sidewall of the processing vessel 10 and between the supporting table 14 and the sidewall of the processing vessel 10. A bottom portion of the space is connected to an exhaust opening 62 of the processing vessel 10. An exhaust line 64 communicating with the exhaust opening 62 is connected to a bottom portion of the processing vessel 10. The exhaust line 64 is connected to an exhaust device 66. The exhaust device 66 is equipped with a vacuum pump such as a turbo molecular pump, and is configured to decompress the internal space of the processing vessel 10 to a required pressure level. Further, an opening 68 for carry-in/out of the processing target object W is formed at the sidewall of the processing vessel 10. A gate valve 70 for opening/closing the opening 68 is provided at the sidewall of the processing vessel 10.

Further, the plasma processing apparatus 1 is equipped with a main controller 72. The main controller 72 includes one or more microcomputers. The main controller 72 controls operations of individual components of the plasma processing apparatus 1, e.g., the high frequency power supplies 36 and 38, the matching devices 40 and 42, the gas supply system 55 (i.e., the multiple number of flow rate controllers of the flow rate controller group 58 and the multiple number of valves of the valve group 60) and the exhaust device 66, and controls an overall operation of the plasma processing apparatus 1 according to software (programs) and recipe data stored in an external memory or an internal memory. Further, the main controller 72 is connected with a manipulation panel for man-machine interface including an input device such as a keyboard and a display such as a liquid crystal display, and an external memory device configured to store various programs and various data such as recipes and setting values.

A basic operation of the plasma processing apparatus is performed as follows. First, the gate valve 70 is opened, and the processing target object W is carried into the processing vessel 10 through the opening 68. The processing target object W carried into the processing vessel 10 is placed on the electrostatic chuck 18. Then, a gas is introduced into the processing vessel 10 from the gas supply system 55, and the exhaust device 66 is operated such that a pressure in the internal space of the processing vessel 10 is set to a preset pressure value. Further, the high frequency power RF1 from the high frequency power supply 36 is supplied to the susceptor 16, and, when necessary, the high frequency power RF2 from the high frequency power supply 38 is supplied to the susceptor 16. Further, the DC voltage from the DC power supply 24 is applied to the electrode 20 of the electrostatic chuck 18, and the processing target object W is held on the electrostatic chuck 18. The gas supplied into the processing vessel 10 is excited by high frequency electric field generated between the susceptor 16 and the upper electrode 46. As a result, plasma is generated. The processing target object W is processed by radicals and/or ions from the generated plasma.

Figure 2:
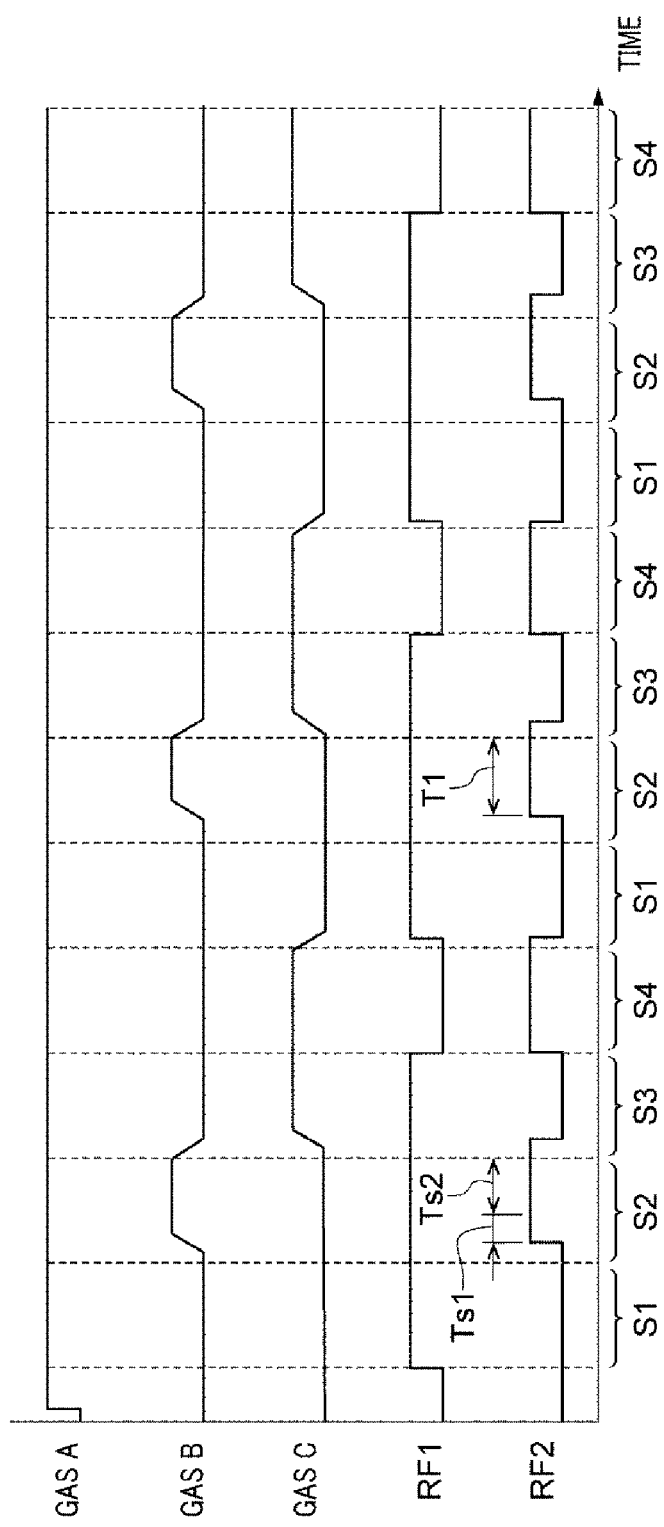
FIG. 2 is a timing chart for a plasma processing method according to the exemplary embodiment.

A plasma processing method according to an exemplary embodiment (hereinafter, referred to as "method MT"), which is performed in the above-described plasma processing apparatus 1, includes a plurality of first processes S1 and a multiplicity of second processes S2 which are performed alternately with the first processes S1. FIG. 2 provides timing charts for the plasma processing method according to the exemplary embodiment. A horizontal axis in FIG. 2 indicates time. In FIG. 2, timing charts of a gas A, a gas B, a gas C, a high frequency power RF1 and a high frequency power RF2 in the method MT are individually provided. In FIG. 2, a level of the timing chart of the gas A indicates the amount of the gas A which reaches the inside of the processing vessel 10. This is the same for the timing charts of the gas B and the gas C. Further, a high level of the high frequency power RF1 indicates that the high frequency power RF1 is supplied to the susceptor 16, whereas a low level of the high frequency power RF1 indicates that the high frequency power RF1 is not supplied to the susceptor 16. These are the same for the timing chart of the high frequency power RF2.

In the first process S1 of the method MT, plasma of a first gas is generated within the processing vessel 10 in which a processing target object W is accommodated. In the first process S1, the gas supply system 55 and the high frequency power supply 36 are controlled by the main controller 72. To elaborate, in the first process S1, the gas supply system 55 is controlled to supply the first gas into the processing vessel 10. To be more specific, when beginning the first process S1, the main controller 72 sends, to the gas supply system 55, a gas switching signal for switching a gas to be supplied into the processing vessel 10 to the first gas. Under this control over the gas supply system 55 in the first process S1, the gas supply system 55 opens a valve belonging to the valve group 60 connected to a gas source for the first gas, and sets an output flow rate of a flow rate controller belonging to the flow rate controller group 58 connected to this corresponding gas source to a preset value. Further, in the first process S1, the high frequency power supply 36 is controlled by the main controller 72 to supply the high frequency power RF1 to the susceptor 16. As a result, the plasma of the first gas is generated in the first process S1. As one example, as depicted in FIG. 2, the first gas includes only the gas A. The gas A is, for example, a rare gas such as an Ar gas. Further, in the first process S1, a high frequency power RF2 from the high frequency power supply 38 is not supplied to the susceptor 16.

In the second process S2, plasma of a second gas containing a gas different from the first gas is generated within the processing vessel 10 in which the processing target object W is accommodated. In the second process S2, the gas supply system 55, the high frequency power supply 36 and the high frequency power supply 38 are controlled by the main controller 72. To elaborate, in the second process S2, the gas supply system 55 is controlled to supply the second gas into the processing vessel 10. To be more specific, when starting the second process S2, the main controller 72 sends, to the gas supply system 55, a gas switching signal for switching the gas to be supplied into the processing vessel 10 to the second gas from the first gas. Under this control over the gas supply system 55 in the second process S2, the gas supply system 55 opens a valve belonging to the valve group 60 connected to a gas source for the second gas and sets an output flow rate of a flow rate controller belonging to the flow rate controller group 58 connected to the corresponding gas source to a predetermined value. Further, in the second process S2, the high frequency power supply 36 is controlled by the main controller 72 to supply the high frequency power RF1 to the susceptor 16 in continuation with the first process S1 which is performed just before the corresponding second process S2. As a result, the plasma of the second gas is generated in the second process S2. As one example, as shown in FIG. 2, the second gas contains the gas A and the gas B added to the gas A. The gas B is, by way of non-limiting example, a fluorocarbon gas.

It takes some time to a time point when the second gas reaches the inside of the processing vessel 10 from a time point when the gas switching signal is sent to the gas supply system 55. Accordingly, in the second process S2, in order to detect the reach of the second gas within the processing vessel 10, it is determined by an operation unit of the matching device 40 whether a parameter to be described later exceeds a threshold value. If the parameter is found to exceed the threshold value, it is decided that the second gas has reached the inside of the processing vessel 10, and the operation unit of the matching device 40 sends, to the high frequency power supply 38, a high frequency power supply start signal for starting the supply of the high frequency power RF2 to the susceptor 16.

As shown in FIG. 2, according to the exemplary embodiment, the method MT may further include a multiplicity of third processes S3 and a multiplicity of fourth processes S4. Each of the plurality of third processes S3 is performed after each corresponding one of the multiplicity of second processes S2, and each of the multiplicity of fourth processes S4 is performed after each corresponding one of the multiplicity of third processes S3.

In the third process S3, plasma of a third gas is generated within the processing vessel 10 in which the processing target object W is accommodated. In the third process S3, the gas supply system 55 and the high frequency power supply 36 are controlled by the main controller 72. To elaborate, in the third process S3, the gas supply system 55 is controlled to supply the third gas into the processing vessel 10 in which the processing target objet W is placed. To be more specific, when starting the third process S3, the main controller 72 sends, to the gas supply system 55, a gas switching signal for switching the gas to be supplied into the processing vessel 10 to the third gas from the second gas. Under this control over the gas supply system 55 in the third process S3, the gas supply system 55 opens a valve belonging to the valve group 60 connected to a gas source for the third gas, and sets an output flow rate of a flow rate controller belonging to the flow rate controller group 58 connected to this corresponding gas source to a preset value. Further, in the third process S3, the high frequency power supply 36 is controlled by the main controller 72 to supply the high frequency power RF1 to the susceptor 16 in continuation with the second process S2 which is performed just before the corresponding third process S3. As a result, the plasma of the third gas is generated in the third process S3. As one example, as shown in FIG. 2, the third gas includes the gas A and the gas C added to the gas A. The gas C is, for example, an oxygen gas. Further, in the third process S3, the high frequency power RF2 from the high frequency power supply 38 is not supplied to the susceptor 16. As illustrated in FIG. 2, however, the high frequency power RF2 may be supplied to the susceptor 16 continuously from the second process S2 during a time period from a start time point of the third process S3 until the third gas reaches the inside of the processing vessel 10. The time length during which the high frequency power RF2 is supplied in the third process S3 may be a predetermined time length or a time length taken before a parameter to be described later exceeds a threshold value.

In the fourth process S4, plasma of a fourth gas is generated within the processing vessel 10 in which the processing target object W is accommodated. In the fourth process S4, the gas supply system 55 and the high frequency power supply 38 are controlled by the main controller 72. To elaborate, in the fourth process S4, the gas supply system 55 is controlled to supply the fourth gas into the processing vessel 10 in which the processing target object W is placed. To be more specific, when starting the fourth process S4, the main controller 72 sends, to the gas supply system 55, a gas switching signal for switching the gas to be supplied into the processing vessel 10 to the fourth gas from the third gas. Under this control over the gas supply system 55 in the fourth process S4, the gas supply system 55 opens a valve belonging to the valve group 60 connected to a gas source for the fourth gas and sets an output flow rate of a flow rate controller belonging to the flow rate controller group 58 connected to this corresponding gas source to a predetermined value. Further, in the fourth process S4, the high frequency power supply 38 is controlled by the main controller 72 to supply the high frequency power RF2 to the susceptor 16. As one example, as shown in FIG. 2, the fourth gas contains the gas A and the gas C added to the gas A. The gas C may be, by way of non-limiting example, on oxygen gas. Furthermore, in the fourth process S4 as an example shown in FIG. 2, the high frequency power RF1 from the high frequency power supply 36 is not supplied to the susceptor 16.

As depicted in FIG. 2, in the subsequent first process S1 performed after the fourth process S4, the high frequency power RF2 may be supplied to the susceptor 16 continuously from the fourth process S4 until the first gas reaches the inside of the processing vessel 10 from a start time point of the first process S1. The time length during which the high frequency power RF2 is supplied in the corresponding first process S1 performed after the fourth process S4 may be a preset time length. In the corresponding first process S1 performed after the fourth process S4, the supply of the high frequency power RF1 may be begun at an end time point when this time length ends.

Figure 3:
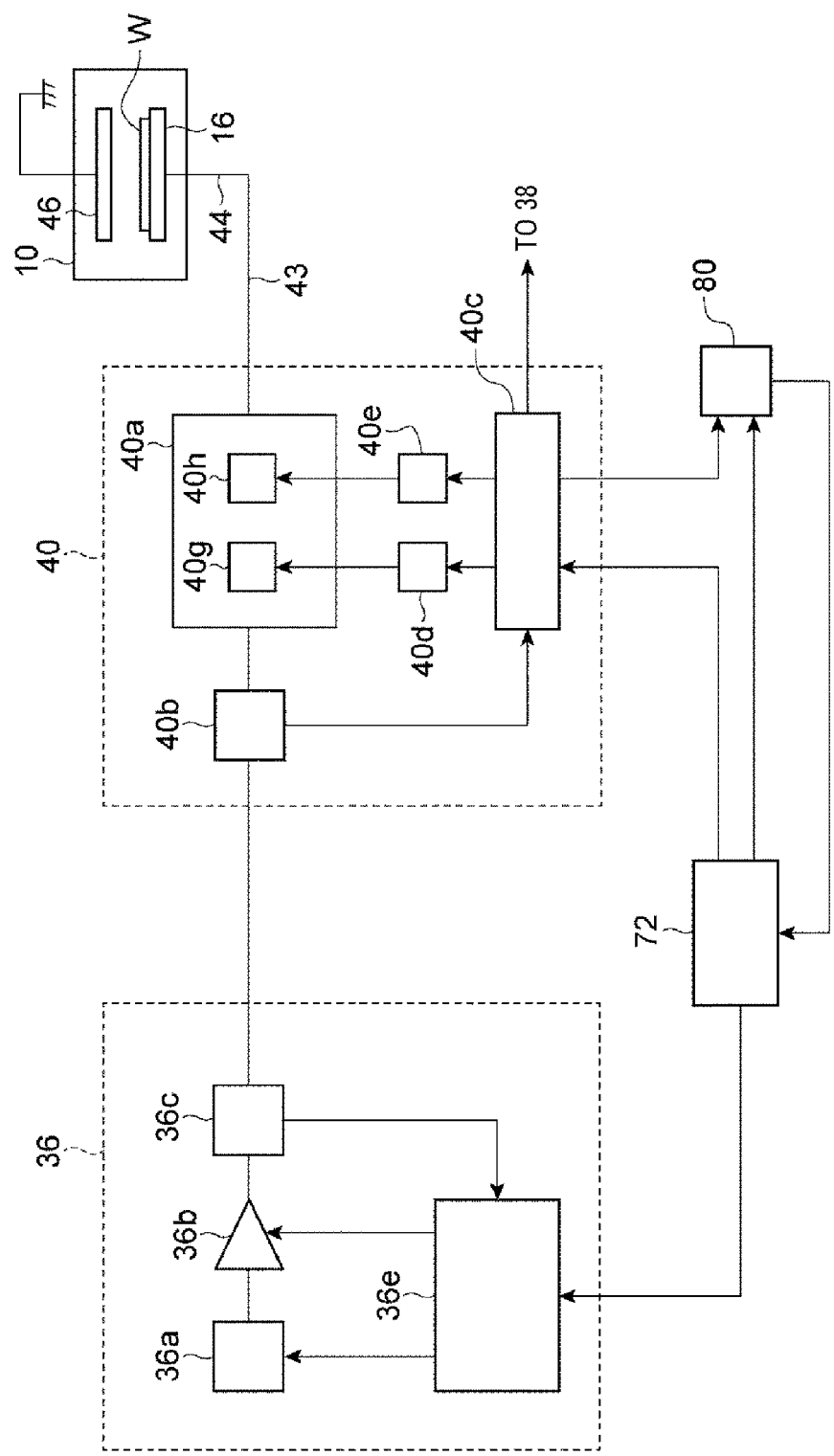
FIG. 3 is a diagram illustrating configurations of a first high frequency power supply and a first matching device.
Figure 4:
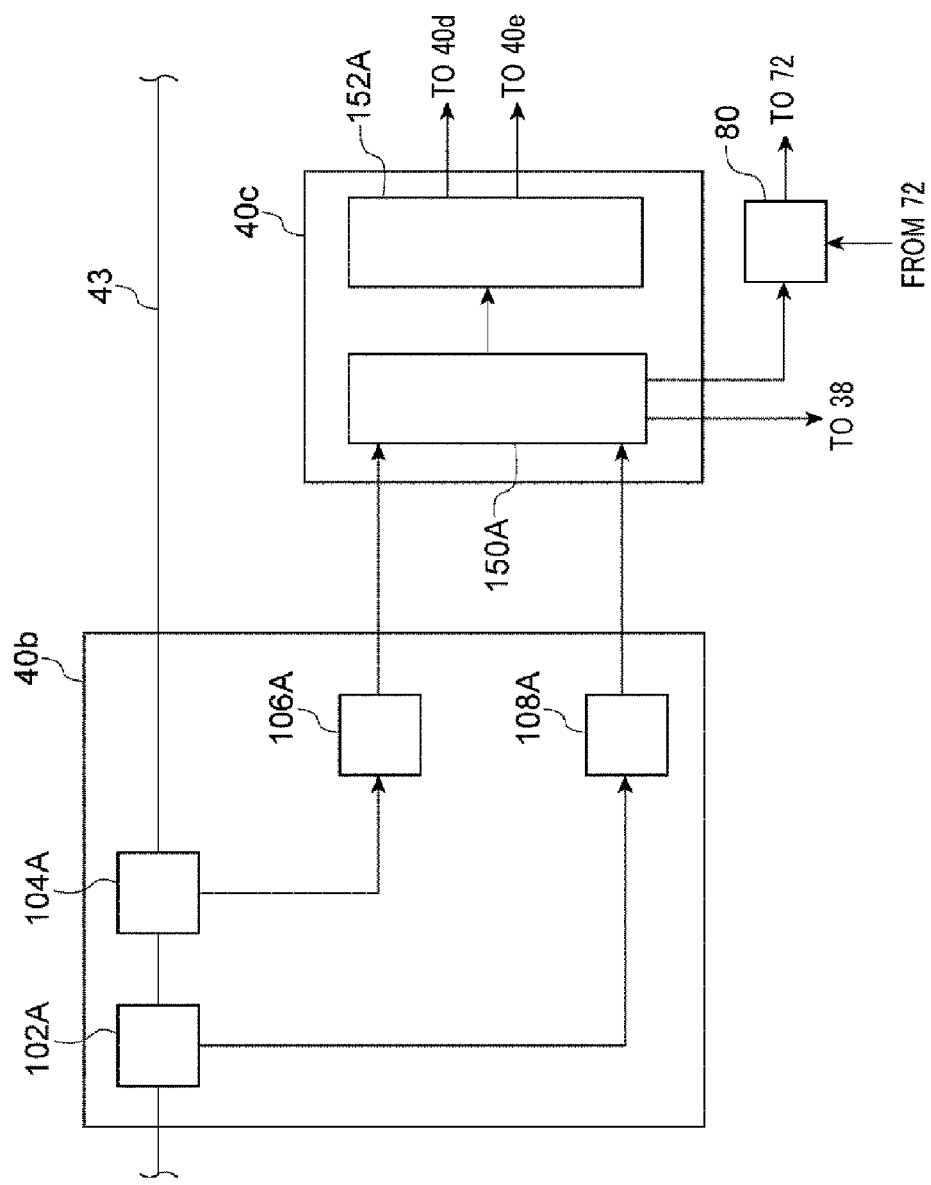
FIG. 4 is a diagram illustrating configurations of a sensor and a controller of the first matching device.
Figure 5:
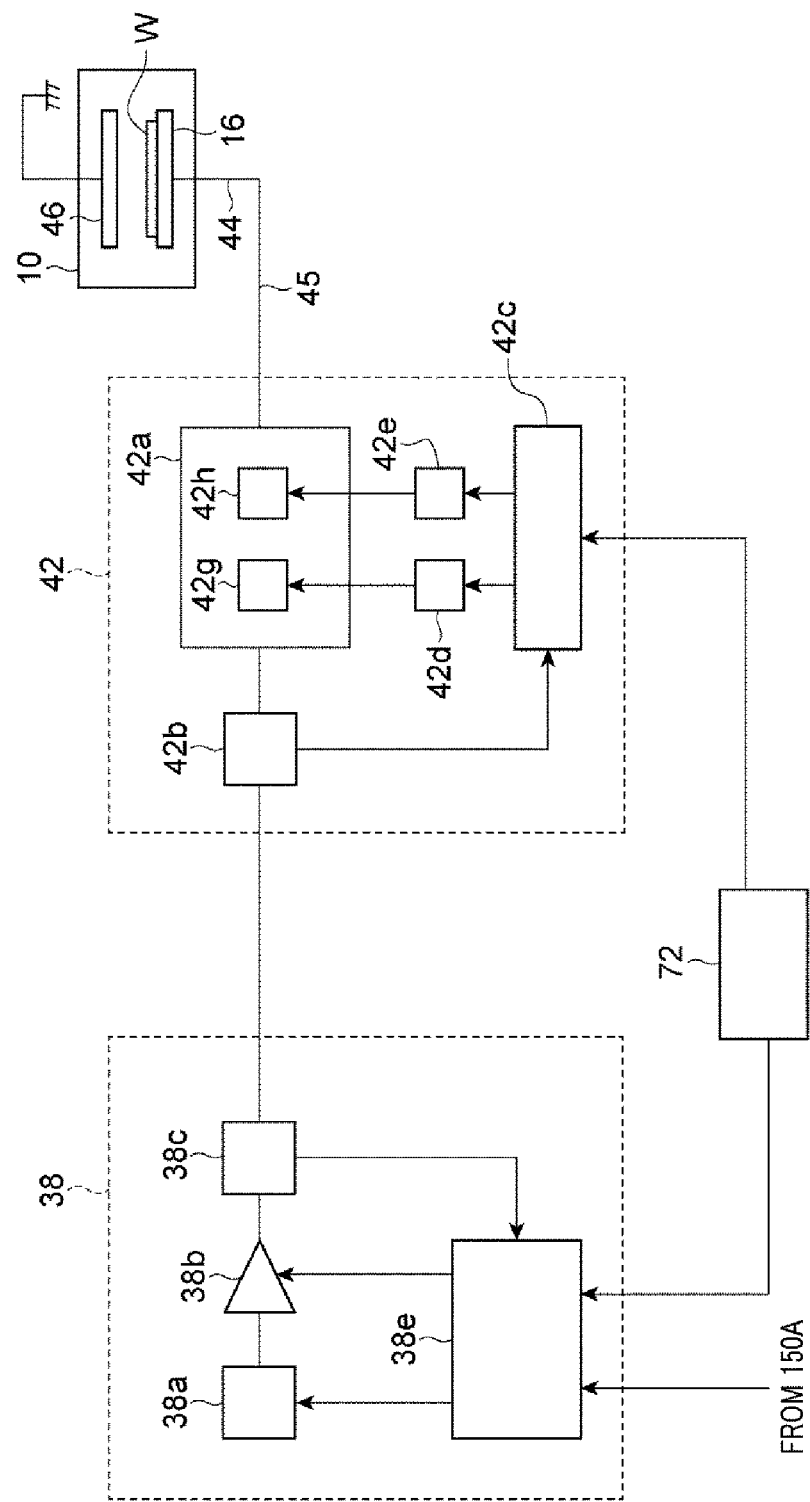
FIG. 5 is a diagram illustrating configurations of a second high frequency power supply and a second matching device.
Figure 6:
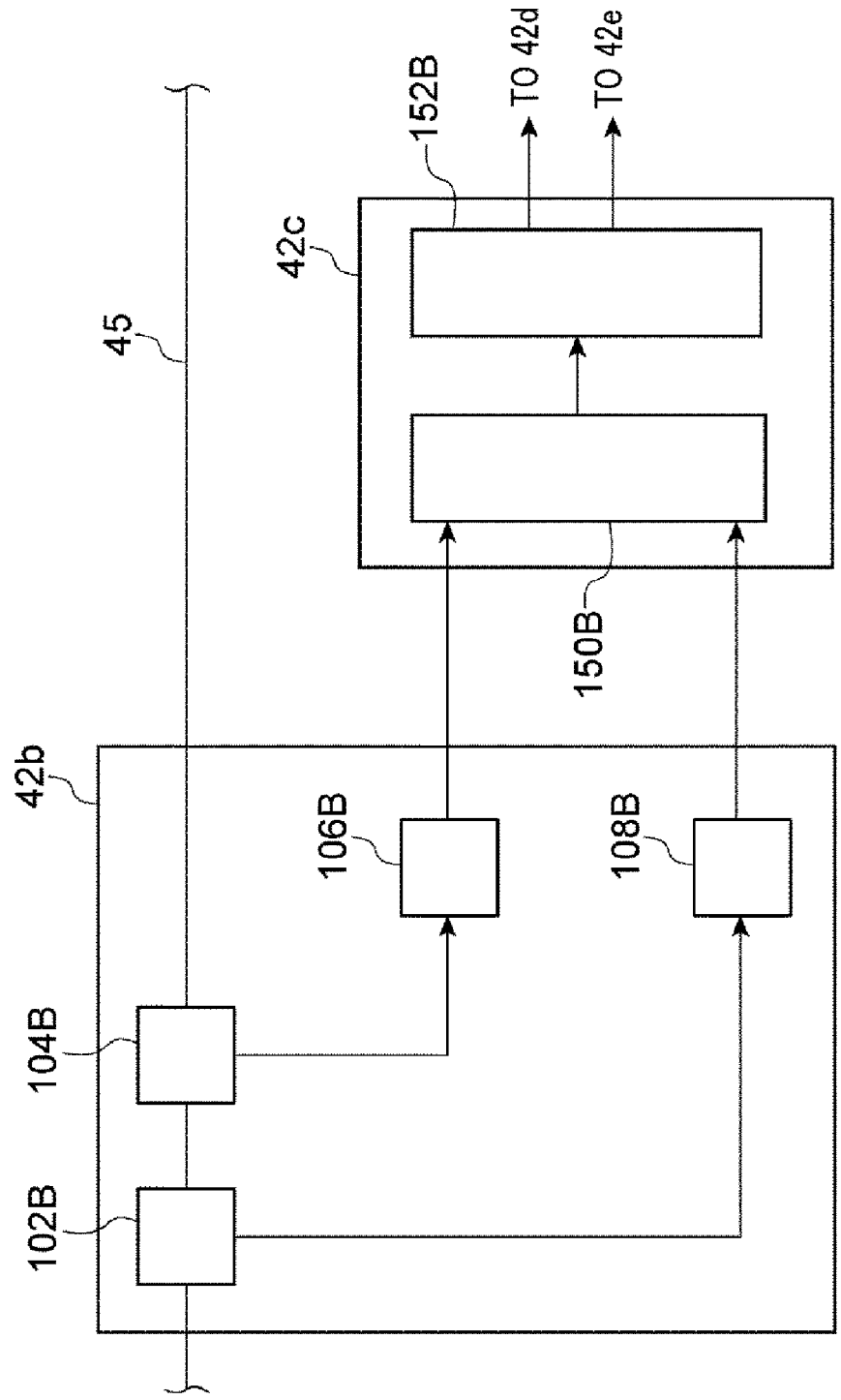
FIG. 6 is a diagram illustrating configurations of a sensor and a controller of the second matching device.

Now, referring to FIG. 3 to FIG. 6, the high frequency power supply 36 and the matching device 40, and the high frequency power supply 38 and the matching device 42 will be elaborated. FIG. 3 is a diagram illustrating an example configuration of the high frequency power supply 36 and the matching device 40. FIG. 4 is a diagram illustrating an example configuration of a controller and a sensor of the matching device 40. Further, FIG. 5 is a diagram illustrating an example configuration of the high frequency power supply 38 and the matching device 42, and FIG. 6 is a diagram illustrating an example configuration of a controller and a sensor of the matching device 42.

According to the exemplary embodiment, the high frequency power supply 36 includes an oscillator 36*a*, a power amplifier 36*b*, a power sensor 36*c* and a power supply controller 36*e*, as shown in FIG. 3. The power supply controller 36*e* is composed of a processor such as a CPU, and controls the oscillator 36*a* and the power amplifier 36*b* by applying control signals to the oscillator 36*a* and the power amplifier 36*b* individually through the use of a signal applied from the main controller 72 and a signal applied from the power sensor 36*c*.

The signal applied from the main controller 72 to the power supply controller 36*e* is a first high frequency power setting signal which is applied when starting each of the above-described processes S1 to S4. The first high frequency power setting signal is configured to instruct a supply or a stop of the supply of the high frequency power RF1 in each of the processes S1 to S4 and configured to designate a power and a set frequency of the high frequency power RF1. In the present exemplary embodiment, this set frequency is a basic frequency $f_{B1}$. Further, in the following description, when it is described that a high frequency power is ON, it implies that the high frequency power is being supplied to the susceptor 16, whereas when it is recited that a high frequency power is OFF, it means that the high frequency power is not being supplied to the susceptor 16.

If the first high frequency power setting signal applied when starting each of the processes S1 to S4 instructs the high frequency power RF1 to be ON, the power supply controller 36*e* controls the oscillator 36*a* to output a high frequency power having a frequency designated by the first high frequency power setting signal. An output of the oscillator 36*a* is connected to an input of the power amplifier 36*b*. The high frequency power output from the oscillator 36*a* is input to the power amplifier 36*b*. The power amplifier 36*b* amplifies the input high frequency power to output the high frequency power RF1 having a power designated by the first high frequency power setting signal from the output thereof. Accordingly, the high frequency power RF1 is output from the high frequency power supply 36.

The power sensor 36*c* is provided at a rear end of the power amplifier 36*b*. The power sensor 36*c* is equipped with a directional coupler, a progressive wave power detector and a reflection wave power detector. The directional coupler sends a part of a progressive wave of the high frequency power RF1 to the progressive wave power detector, and sends a reflection wave to the reflection wave power detector. A signal specifying the frequency of the high frequency power RF1 is applied to this power sensor 36*c* from the power supply controller 36*e*. The progressive wave power detector generates a measurement value of a power of a component having the same frequency as the frequency of the high frequency power RF1 among all frequency components of the progressive wave, i.e., generates a progressive wave power measurement value PF1. This progressive wave power measurement value is sent to the power supply controller 36e for power feedback.

The reflection wave power detector generates a measurement value of a power of a component having the same frequency as the frequency of the high frequency power RF1 among all frequency components of the reflection wave, i.e., generates a reflection wave power measurement value PR11, and also generates a measurement value of a total power of the all frequency components of the reflection wave, i.e., generates a reflection wave power measurement value PR12. The reflection wave power measurement value PR11 is sent to the main controller 72 for monitor display. Further, the reflection wave power measurement value PR12 is sent to the power supply controller 36e for protection of the power amplifier 36b.

As shown in FIG. 3, the matching device 40 is equipped with a matching circuit 40a, a sensor 40b, a controller 40c and actuators 40d and 40e. The matching circuit 40a includes variable reactance elements 40g and 40h. The variable reactance elements 40g and 40h may be implemented by, but not limited to, variable capacitors. Further, the matching circuit 40a may further include an inductor or the like.

The controller 40c is composed of, for example, a processor, and is operated under the control of the main controller 72. The controller 40c is configured to calculate a load impedance of the high frequency power supply 36 by using a measurement value sent from the sensor 40b. Further, the controller 40c is also configured to adjust a reactance of each of the variable reactance elements 40g and 40h by controlling the actuators 40d and 40e such that the calculated load impedance approximates to an output impedance of the high frequency power supply 36 or a matching point. Each of the actuators 40d and 40e is implemented by, for example, a motor.

Furthermore, the controller 40c is also configured to calculate a parameter to be described later by using the measurement value sent from the sensor 40b and configured to determine a start timing for the supply of the high frequency power RF2 in the second process S2.

As depicted in FIG. 4, the sensor 40b includes a current detector 102A, a voltage detector 104A, a filter 106A and a filter 108A. The voltage detector 104A is configured to detect a voltage waveform of the high frequency power RF1 transmitted on the power feed line 43 and is configured to output a voltage waveform analog signal indicating the corresponding voltage waveform. This voltage waveform analog signal is input to the filter 106A. The filter 106A is configured to generate a voltage waveform digital signal by digitizing the voltage waveform analog signal input thereto. Further, the filter 106A is configured to generate a filtered voltage waveform signal by extracting, from the voltage waveform digital signal, only the component of the set frequency of the high frequency power RF1 specified by the signal from the main controller 72. The filtered voltage waveform signal generated by the filter 106A is sent to an operation unit 150A of the controller 40c. Further, the filter 106A may be composed of, by way of non-limiting example, a FPGA (Field Programmable Gate Array).

The current detector 102A is configured to detect a current waveform of the high frequency power RF1 transmitted on the power feed line 43 and is configured to output a current waveform analog signal indicating the corresponding current waveform. This current waveform analog signal is input to the filter 108A. The filter 108A is configured to generate a current waveform digital signal by digitizing the current waveform analog signal input thereto. Further, the filter 108A is configured to generate a filtered current waveform signal by extracting, from the current waveform digital signal, only a component of the set frequency of the high frequency power RF1 specified by the signal from the main controller 72. The filtered current waveform signal generated by the filter 108A is sent to the operation unit 150A of the controller 40c. Further, the filter 108A may be composed of, by way of non-limiting example, a FPGA (Field Programmable Gate Array).

In order to achieve impedance matching in the matching device 40, the operation unit 150A of the controller 40c calculates a load impedance ZL1 of the high frequency power supply 36 by using the filtered voltage waveform signal sent from the filter 106A and the filtered current waveform signal sent from the filter 108A. To elaborate, the operation unit 150A calculates the load impedance ZL1 of the high frequency power supply 36 from an alternating voltage V1 specified by the filtered voltage waveform signal, an alternating current I1 specified by the filtered current waveform signal, and a phase difference $\phi 1$ between the alternating voltage V1 and the alternating current I1. Further, the operation unit 150A is also configured to calculate a parameter to be described later from the alternating voltage V1, the alternating current I1 and the phase difference $\phi 1$. The parameter may be the aforementioned load impedance ZL1. In this case, since the load impedance calculated for the impedance matching of the matching device 40 can be used as the parameter, it is not required to calculate the parameter additionally. Alternatively, the parameter may be any of a load resistance Zr1 and a load reactance Zi1, and a reflection wave coefficient $\Gamma 1$. Still alternatively, one or more of the load impedance ZL1, the load resistance Zr1, the load reactance Zi1 and the reflection wave coefficient $\Gamma 1$ may be used as the parameter calculated by the operation unit 150A.

The load impedance ZL1 is calculated as V1/I1. The load resistance Zr1 is obtained by calculating a real part of the load impedance ZL1, and the load reactance Zi1 is obtained by calculating an imaginary part of the load impedance ZL1. Further, the reflection wave coefficient $\Gamma 1$ is calculating by the following Expression 1.

[Expression 1]

$$\Gamma 1 = \frac{\sqrt{(Zr1 - 50)^2 + (Zi1)^2}}{(Zr1 - 50)^2 + (Zi1)^2} \quad (1)$$

Further, the reflection wave coefficient $\Gamma 1$ may also be calculated as PR11/PF1 by using the progressive wave power measurement value PF1 and the reflection wave power measurement value PR11 obtained by the power sensor 36c.

The operation unit 150A is configured to output the calculated load impedance ZL1 to a matching controller 152A. The matching controller 152A is configured to adjust the reactance of the variable reactance elements 40g and 40h by controlling the actuators 40d and 40e such that the load impedance ZL1 approximates to the output impedance of the high frequency power supply 36 (or the matching point). Accordingly, the impedance matching by the matching device 40 is performed. Further, the matching controller 152A may control the actuators 40*d* and 40*e* such that a moving average value of series of the load impedance ZL1 output by the operation unit 150A approximates to the output impedance of the high frequency power supply 36 (or the matching point).

In addition, the operation unit 150A determines in each second process S2 whether the calculated parameter exceeds a corresponding threshold value. Initially, this threshold value is set to be a preset value which is capable of indicating the reach of the second gas within the processing vessel 10. In case that the parameter is found to exceed the threshold value in each second process S2, the operation unit 150A sends, to the high frequency power supply 38, a high frequency power supply start signal which instructs the corresponding high frequency power supply 38 to start the supply of the high frequency power RF2 to the susceptor 16.

Moreover, in each second process S2, the operation unit 150A sends, to a time adjusting unit 80, first start time specifying information which specifies a time point when the high frequency power supply start signal is sent to the high frequency power supply 38, i.e., a time point when the supply of the high frequency power RF2 by the high frequency power supply 38 is begun. This time adjusting unit 80 may be implemented by, for example, a processor such as a CPU. The time adjusting unit 80 receives, from the main controller 72, second start time specifying information which specifies a time point when each second process S2 is begun. The time adjusting unit 80 calculates a time difference between the time specified by the second start time specifying information and the time specified by the first start time specifying information. The time adjusting unit 80 sends, to the main controller 72, time difference specifying information which specifies this time difference. The main controller 72 receives time difference specifying information for the prior second process S2 from the time adjusting unit 80, and adjusts a processing time length of a subsequent second process S2 which is performed later than the corresponding second process S2 such that the processing time length is increased by the time difference specified by the time difference specifying information.

Further, the operation unit 150A calculates a moving average value of series of the parameter, and adjusts the aforementioned threshold value by using this moving average value. The series of the parameter include a parameter in the state that the impedance matching by the matching device 40 is completed in the completed second process S2 or in each of the completed second process S2 and a second process S2 currently being performed. Each of the parameters included in these series may be the same kind of parameter as the parameter which is compared with the aforementioned threshold value.

Now, reference is made to FIG. 5. As shown in FIG. 5, according to the exemplary embodiment, the high frequency power supply 38 includes an oscillator 38*a*, a power amplifier 38*b*, a power sensor 38*c* and a power supply controller 38*e*. The power supply controller 38*e* is composed of a processor such as a CPU, and controls the oscillator 38*a* and the power amplifier 38*b* by applying control signals to the oscillator 38*a* and the power amplifier 38*b* individually through the use of a signal applied from the main controller 72, a signal applied from the power sensor 38*c* and a signal applied from the operation unit 150A.

The signal applied from the main controller 72 to the power supply controller 38*e* is a second high frequency power setting signal which is applied when starting each of the above-described processes S1 to S4. The second high frequency power setting signal is configured to instruct a supply or a stop of the supply of the high frequency power RF2 in each of the processes S1 to S4 and configured to designate a power and a set frequency of the high frequency power RF2. In the present exemplary embodiment, this set frequency is a basic frequency $f_{B2}$.

If the second high frequency power setting signal applied when starting each of the processes S1 to S4 instructs the high frequency power RF2 to be ON, the power supply controller 38*e* controls the oscillator 38*a* to output a high frequency power having a frequency designated by the second high frequency power setting signal. An output of the oscillator 38*a* is connected to an input of the power amplifier 38*b*. The high frequency power output from the oscillator 38*a* is input to the power amplifier 38*b*. The power amplifier 38*b* amplifies the input high frequency power to output the high frequency power RF2 having a power designated by the second high frequency power setting signal from the output thereof. In the example shown in FIG. 2, the high frequency power supply 38 is configured to output the high frequency power RF2 at a time when starting each fourth process S4. Further, in each second process S2, the high frequency power supply 38 starts the supply of the high frequency power RF2 to the susceptor 16 when it receives the high frequency power supply start signal from the operation unit 150A.

The power sensor 38*c* is provided at a rear end of the power amplifier 38*b*. The power sensor 38*c* is equipped with a directional coupler, a progressive wave power detector and a reflection wave power detector. The directional coupler sends a part of a progressive wave of the high frequency power RF2 to the progressive wave power detector, and sends a reflection wave to the reflection wave power detector. A signal specifying the frequency of the high frequency power RF2 is applied to this power sensor 38*c* from the power supply controller 38*e*. The progressive wave power detector generates a measurement value of a power of a component having the same frequency as the frequency of the high frequency power RF2 among all frequency components of the progressive wave, i.e., generates a progressive wave power measurement value PF2. This progressive wave power measurement value is sent to the power supply controller 38*e* for power feedback.

The reflection wave power detector generates a measurement value of a power of a component having the same frequency as the frequency of the high frequency power RF2 among all frequency components of the reflection wave, i.e., generates a reflection wave power measurement value PR21, and also generates a measurement value of a total power of the all frequency components of the reflection wave, i.e., generates a reflection wave power measurement value PR22. The reflection wave power measurement value PR21 is sent to the main controller 72 for monitor display. Further, the reflection wave power measurement value PR22 is sent to the power supply controller 38*e* for protection of the power amplifier 38*b*.

As shown in FIG. 5, the matching device 42 is equipped with a matching circuit 42*a*, a sensor 42*b*, a controller 42*c* and actuators 42*d* and 42*e*. The matching circuit 42*a* includes variable reactance elements 42*g* and 42*h*. The variable reactance elements 42*g* and 42*h* may be implemented by, but not limited to, variable capacitors. Further, the matching circuit 42*a* may further include an inductor or the like.

The controller 42*c* is composed of, for example, a processor, and is operated under the control of the main controller 72. The controller 42*c* is configured to calculate a load impedance of the high frequency power supply 38 by using a measurement value sent from the sensor 42*b*. Further, the controller 42*c* is also configured to adjust a reactance of each of the variable reactance elements 42*g* and 42*h* by controlling the actuators 42*d* and 42*e* such that the calculated load impedance approximates to an output impedance of the high frequency power supply 38 or a matching point. Each of the actuators 42*d* and 42*e* is implemented by, for example, a motor.

As depicted in FIG. 6, the sensor 42*b* includes a current detector 102B, a voltage detector 104B, a filter 106B and a filter 108B. The voltage detector 104B is configured to detect a voltage waveform of the high frequency power RF2 transmitted on the power feed line 45, and is configured to output a voltage waveform analog signal indicating the corresponding voltage waveform. This voltage waveform analog signal is input to the filter 106B. The filter 106B is configured to generate a voltage waveform digital signal by digitizing the voltage waveform analog signal input thereto. Further, the filter 106B is configured to generate a filtered voltage waveform signal by extracting, from the voltage waveform digital signal, only the component of the set frequency of the high frequency power RF2 specified by the signal from the main controller 72. The filtered voltage waveform signal generated by the filter 106B is sent to an operation unit 150B of the controller 42*c*.

The current detector 102B is configured to detect a current waveform of the high frequency power RF2 transmitted on the power feed line 45, and is configured to output a current waveform analog signal indicating the corresponding current waveform. This current waveform analog signal is input to the filter 108B. The filter 108B is configured to generate a current waveform digital signal by digitizing the current waveform analog signal input thereto. Further, the filter 108B is configured to generate a filtered current waveform signal by extracting, from the current waveform digital signal, only a component of the set frequency of the high frequency power RF2 specified by the signal from the main controller 72. The filtered current waveform signal generated by the filter 108B is sent to the operation unit 150*6* of the controller 42*c*.

The operation unit 150*6* of the controller 42*c* calculates a load impedance ZL2 of the high frequency power supply 38 by using the filtered voltage waveform signal sent from the filter 106B and the filtered current waveform signal sent from the filter 108B. To elaborate, the operation unit 150B calculates the load impedance ZL2 from an alternating voltage V2 specified by the filtered voltage waveform signal, an alternating current I2 specified by the filtered current waveform signal, and a phase difference φ2 between the alternating voltage V2 and the alternating current I2.

The operation unit 150B outputs the calculated load impedance ZL2 to a matching controller 152B. The matching controller 152B adjusts the reactance of the variable reactance elements 42*g* and 42*h* by controlling the actuators 42*d* and 42*e* such that the load impedance ZL2 approximates to the output impedance of the high frequency power supply 38 (or the matching point). Accordingly, impedance matching by the matching device 42 is achieved. Further, the matching controller 152B may control the actuators 42*d* and 42*e* such that a moving average value of series of the load impedance ZL2 output by the operation unit 150B approximates to the output impedance of the high frequency power supply 38 (or the matching point).

Figure 7:
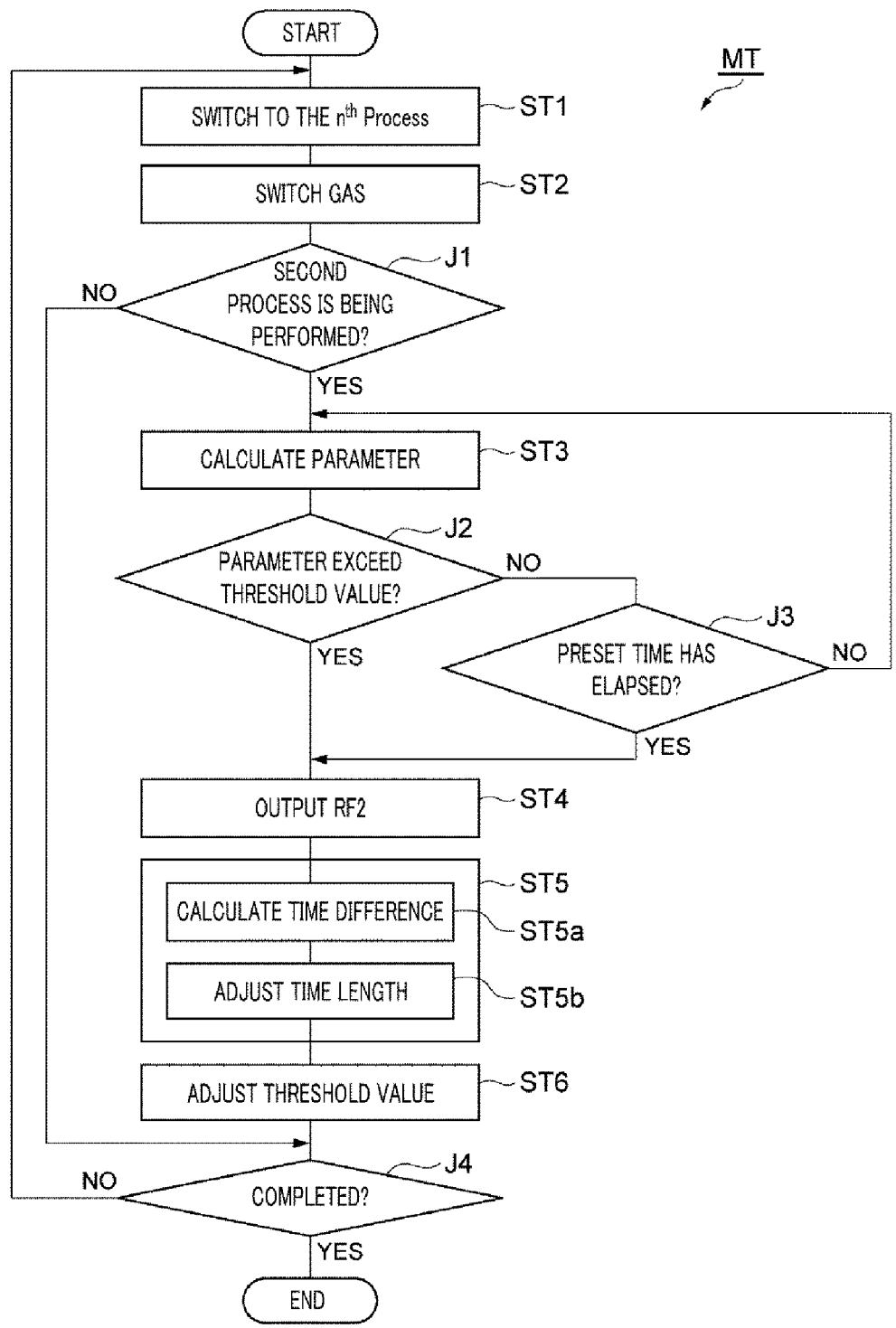
FIG. 7 is a flowchart for describing the plasma processing method according to the exemplary embodiment.

Hereinafter, the method MT will be described in detail with reference to FIG. 7 as well as FIG. 2. FIG. 7 is a flowchart for describing the plasma processing method according to the exemplary embodiment. In the method MT, the n$^{th}$ process is begun in a step ST1. Here, "n" denotes an integer ranging from 1 to 4 in the example shown in FIG. 2.

In the step ST1, the main controller 72 switches the processes to be performed according to a recipe. In the example shown in FIG. 2, the main controller 72 switches the processes in the order of the first process S1, the second process S2, the third process S3 and the fourth process S4, and a sequence including each of the processes S1 to S4 is repeated a preset number of times.

In the step ST1 of each of the processes S1 to S4, the gas switching signal is applied to the gas supply system 55 from the main controller 72 according to the recipe. In the example shown in FIG. 2, the gas switching signal is sent to the gas supply system 55 from the main controller 72 to allow the gas supply system 55 to supply the first gas in the step ST1 of the first process S1, the second gas in the step ST1 of the second process S2, the third gas in the step ST1 of the third process S3 and the fourth gas in the step ST1 of the fourth process S4. Further, when starting the method MT, the gas supply system 55 is controlled by the main controller 72 to start the supply of the first gas before the first process S1 is begun.

Further, in the step ST1, the aforementioned first high frequency power setting signal which is set according to the process being performed is applied to the high frequency power supply 36 according to the recipe. Further, in the step ST1, the aforementioned second high frequency power setting signal which is set according to the process being performed is applied to the high frequency power supply 38 according to the recipe. In the example of FIG. 2, in the first process S1, the second process S2, and the third process S3, the first high frequency power setting signal is set to instruct the high frequency power RF1 to be supplied to the susceptor 16. Meanwhile, in the fourth process S4, the first high frequency power setting signal is set to instruct the supply of the high frequency power RF1 to the susceptor 16 to be stopped. According to this first high frequency power setting signal, the high frequency power supply 36 supplies the high frequency power RF1 to the susceptor 16 or stops the supply of the high frequency power RF1 to the susceptor 16. Further, in the first process S1 and the third process S3, the second high frequency power setting signal is set to instruct the supply of the high frequency power RF2 to the susceptor 16 to be stopped. Meanwhile, in the second process S2 and in the fourth process S4, the second high frequency power setting signal is set to instruct the high frequency power RF2 to be supplied to the susceptor 16. According to this second high frequency power setting signal, the high frequency power supply 38 supplies the high frequency power RF2 to the susceptor 16 or stops the supply of the high frequency power RF2 to the susceptor 16. Furthermore, in the second process S2, the supply of the high frequency power RF2 to the susceptor 16 is started by performing a step ST4 to be described later.

Furthermore, in the step ST1, the gas exhaust device 66 is controlled by the main controller 72 such that an internal pressure of the processing vessel 10 is maintained at a pressure value designated by the recipe according to the process being performed. Further, in the step ST1 of the process in which the high frequency power RF1 is supplied, a signal specifying the frequency of the high frequency power RF1 is applied to the matching device 40. Accordingly, the matching device 40 calculates the load impedance of the high frequency power supply 36 having a frequency corresponding to the set frequency of the high frequency power RF1, and then, performs the impedance matching based on the calculated load impedance. Further, in the step ST1 of the process in which the high frequency power RF2 is supplied, a signal specifying the frequency of the high frequency power RF2 is applied to the matching device 42. The matching device 42 calculates the load impedance of the high frequency power supply 38 having a frequency corresponding to the set frequency of the high frequency power RF2, and then, performs the impedance matching based on this calculated load impedance.

In the subsequent step ST2, the gas supply system 55 is switched to supply the gas, which is designated by the gas switching signal from the main controller 72, into the processing vessel 10.

In the method MT, when performing any one of the first process S1, the third process S3 and the fourth process S4, plasma processing of the corresponding process is performed for a time period set by the recipe, and the method MT proceeds to a determination step J4 to be described later (refer to "NO" of the determination step J1). Meanwhile, when performing the second process S2, the method MT proceeds to a step ST3 (refer to of "YES" of the determination step J1), and the aforementioned parameter is obtained by the operation unit 150A in the step ST3.

In a determination step J2, the operation unit 150A determines whether the calculated parameter exceeds a threshold value. If it is determined that the parameter does not exceed the threshold value, the operation unit 150A determines in a determination step J3 whether a preset time has elapsed after the second process S2 is begun. If it is determined in the determination step J3 that the preset time has not elapsed yet, the step ST3 is performed again. Meanwhile, if it is determined in the determination step J3 that the preset time has passed by, the method MT proceeds to a step ST4. Through the determination step J3, it is possible to avoid a problem that the supply of the high frequency power RF2 is not begun due to a malfunction in the second process S2.

Further, in the determination step J2, if it is found out that the parameter exceeds the threshold value, the method MT proceeds to the step ST4. In the step ST4, the high frequency power supply start signal is sent to the high frequency power supply 38 from the operation unit 150A. Accordingly, the supply of the high frequency power RF2 in the second process S2 is begun. Initially, the threshold value is set to be a preset value which is capable of indicating the reach of the second gas within the processing vessel 10.

In the method MT, the high frequency power RF1 is supplied to the susceptor 16 over the first process S1 and the second process S2. In this state, if the gas that exists within the processing vessel 10 is switched from the first gas to the second gas, the impedance of the plasma generated within the processing vessel 10 is changed. Since the aforementioned parameter is varied depending on the impedance of the plasma, this parameter well reflects a change of the gas that exists within the processing vessel 10. In the second process S2 of the method MT, it is detected based on this parameter whether the second gas has reached the inside of the processing vessel 10. Therefore, the timing when the second gas has reached the inside of the processing vessel 10 can be detected with high accuracy. Further, since the supply of the high frequency power RF2 is begun at the moment when the reach of the second gas is detected, the supply of the high frequency power RF2 can be started at an appropriate timing.

Subsequently, in the method MT, a step ST5 is performed. The step ST5 includes a step ST5a and a step ST5b. In the step ST5a, the aforementioned time difference is calculated. To elaborate, in the step ST4 of each of the second processes S2, the first start time specifying information which specifies the time point when the high frequency power supply start signal is sent to the high frequency power supply 38, i.e., the time point when the supply of the high frequency power RF2 by the high frequency power supply 38 is begun is applied to the time adjusting unit 80 from the operation unit 150A. Furthermore, in the step ST1 of each of the second processes S2, the second start time specifying information which specifies the start time of each of the second processes S2 (when performing the step ST1) is applied to the time adjusting unit 80. In the step ST5a, the time difference between the time specified by the second start time specifying information and the time specified by the first start time specifying information is calculated by the time adjusting unit 80. Then, the time difference specifying information which specifies this time difference is sent to the main controller 72 from the time adjusting unit 80. In the subsequent step ST5b, the processing time length of the second process S2 which is performed after the prior second process S2 is adjusted by the main controller 72 such that it is increased as much as the time difference which is specified by the time difference specifying information for the corresponding prior second process S2.

Here, in each of the second processes S2, the processing time length thereof is initially set. Accordingly, if the timing of starting the supply of the high frequency power RF2 is delayed in any one of the second processes S2, the time length of the plasma processing which is performed in the state that the high frequency power RF2 is supplied to the susceptor 16 in this corresponding second process S2 is shortened. In the method MT, however, the processing time length of the second process S2 performed later is increased from the initially determined processing time length as much as the time difference which is calculated for the second process S2 performed before. Therefore, the total processing time length of the processing by the plasma of the second gas which is performed in the state that the high frequency power RF2 is supplied to the susceptor 16 can be maintained substantially constant.

Subsequently, in the method MT, a step ST6 is performed. In the step ST6, the threshold value used in the determination step J2 is adjusted. To elaborate, a moving average value of series of the parameter is calculated in the operation unit 105A, and the threshold value is adjusted by using the moving average value. The series of the parameter include the parameter in the state that the impedance matching by the matching device 40 is completed in the completed second process S2 or in each of the completed second process S2 and the second process S2 being performed. Each of the parameters included in these series may be the same kind of parameter as the parameter which is compared with the aforementioned threshold value. In the state that the impedance matching by the matching device 40 is completed in the process S2, the second gas reaches the inside of the processing vessel 10 sufficiently. Thus, by adjusting the threshold value with the moving average value of the series of the parameter in this state, the timing when the second gas has reached the inside of the processing vessel can be detected with higher accuracy.

Then, in the method MT, the determination step J4 is performed. In the determination step J4, it is determined by the main controller 72 whether the sequence including the processes S1 to S4 has been repeated a preset number of times. If it is determined that the preset number of repetitions of the sequence is not completed yet, the method MT proceeds back to the step ST1, and a subsequent process among the processes S1 to S4 is performed. Meanwhile, if it is found out that the sequence has been repeated the preset number of times, the method MT is ended.

Figure 8:
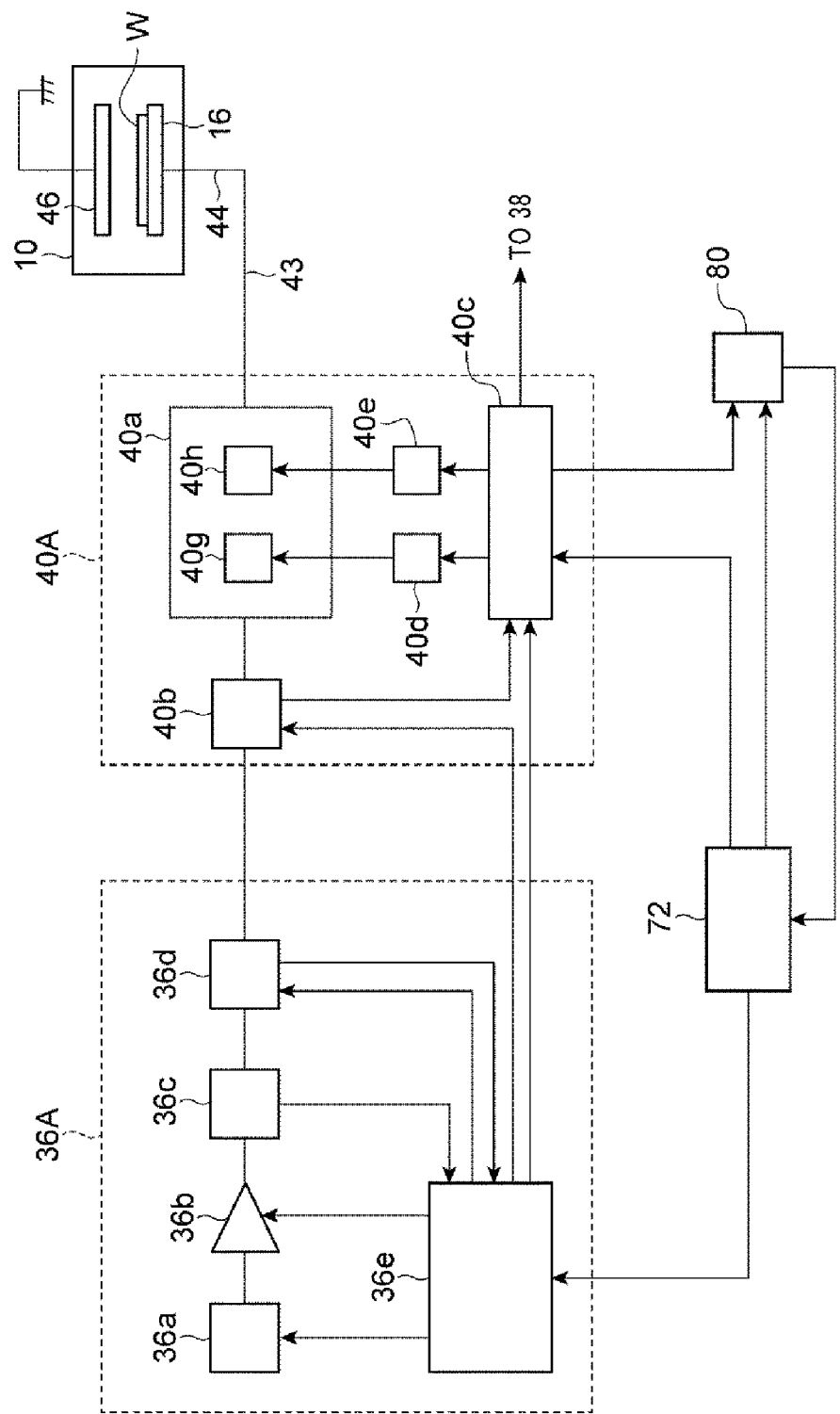
FIG. 8 a diagram illustrating another example of configurations of the first high frequency power supply and the first matching device.
Figure 9:
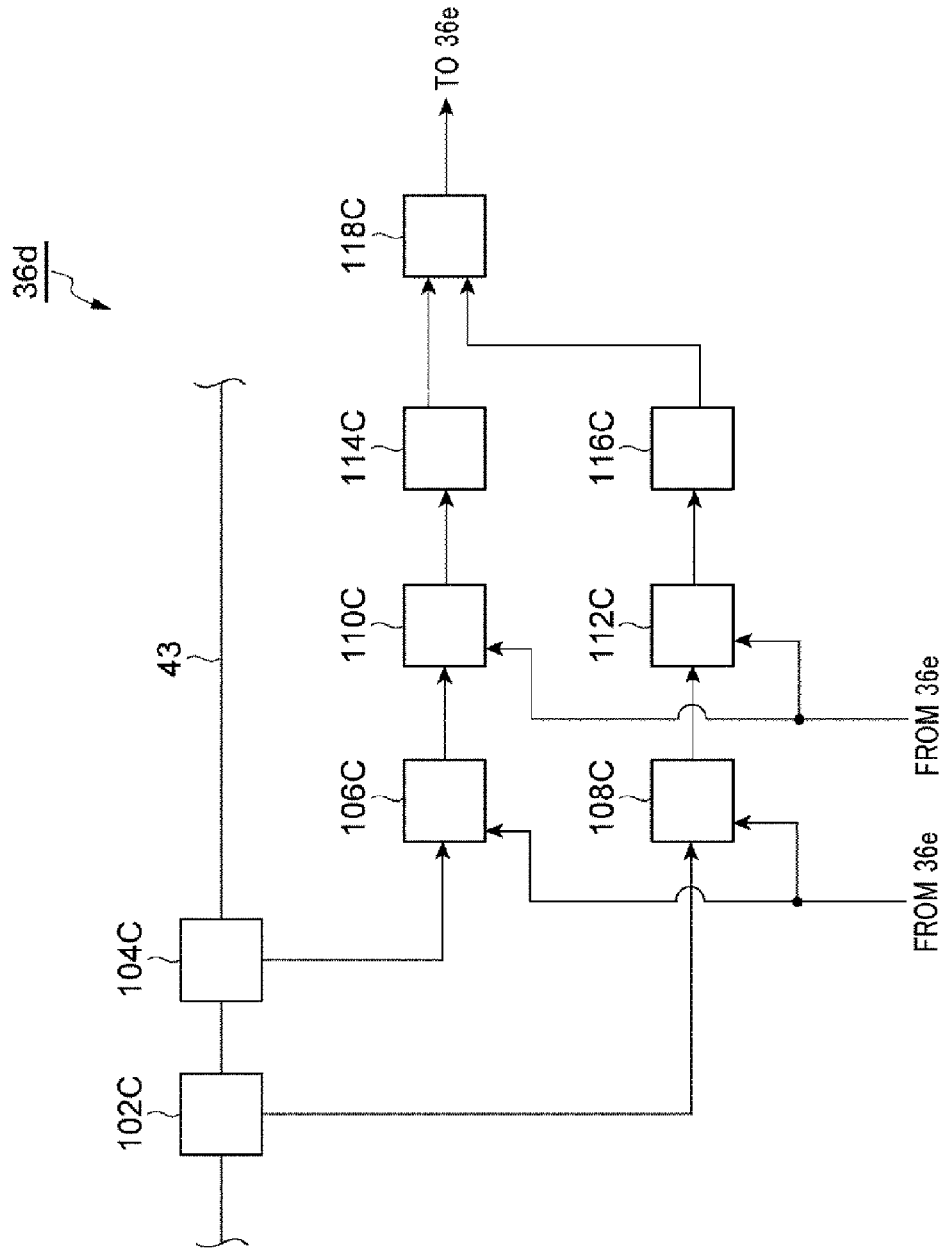
FIG. 9 is a diagram illustrating a configuration of an impedance sensor of the first high frequency power supply shown in FIG. 8.
Figure 10:
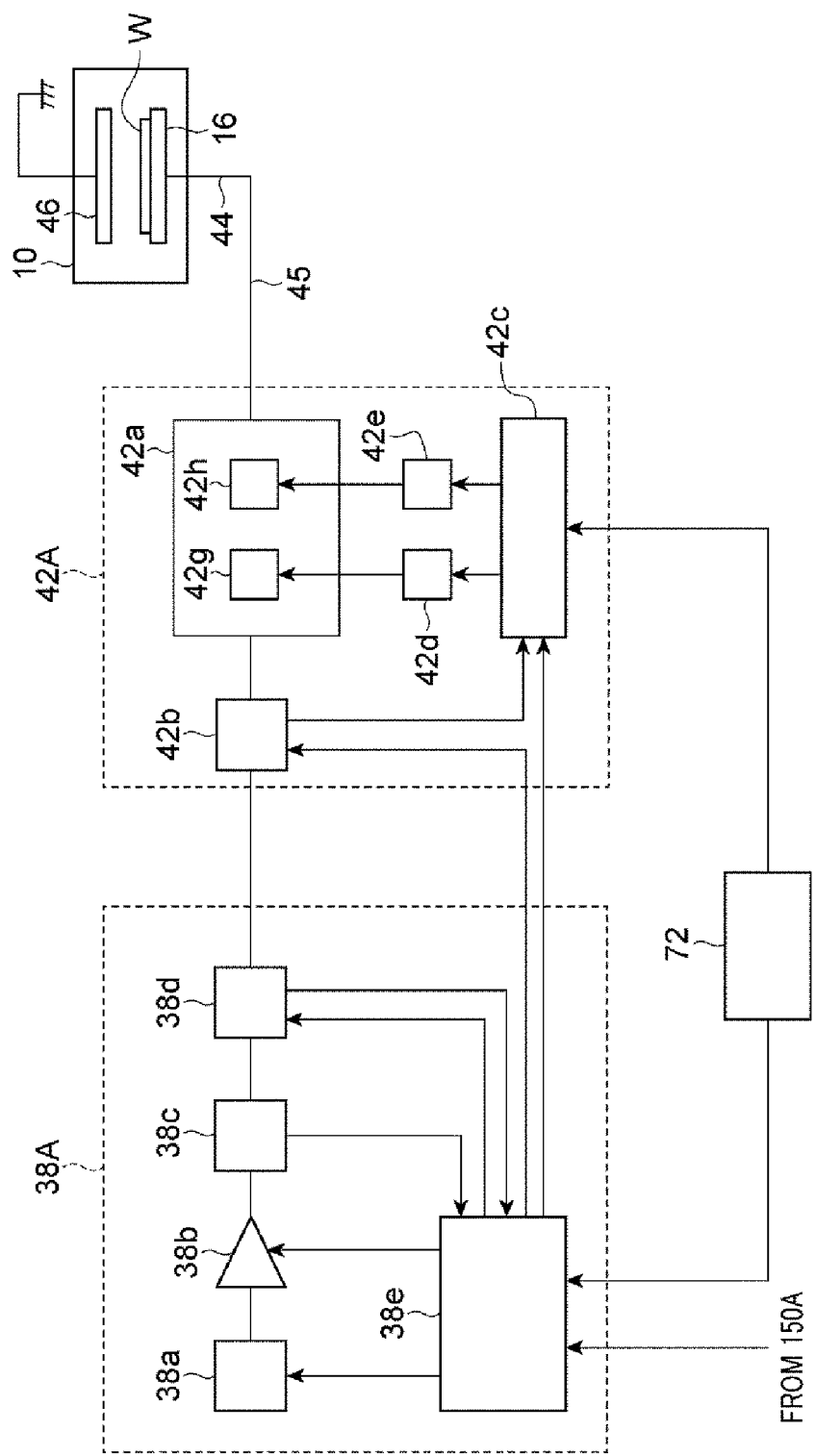
FIG. 10 is a diagram illustrating another example of configurations of the second high frequency power supply and the second matching device.
Figure 11:
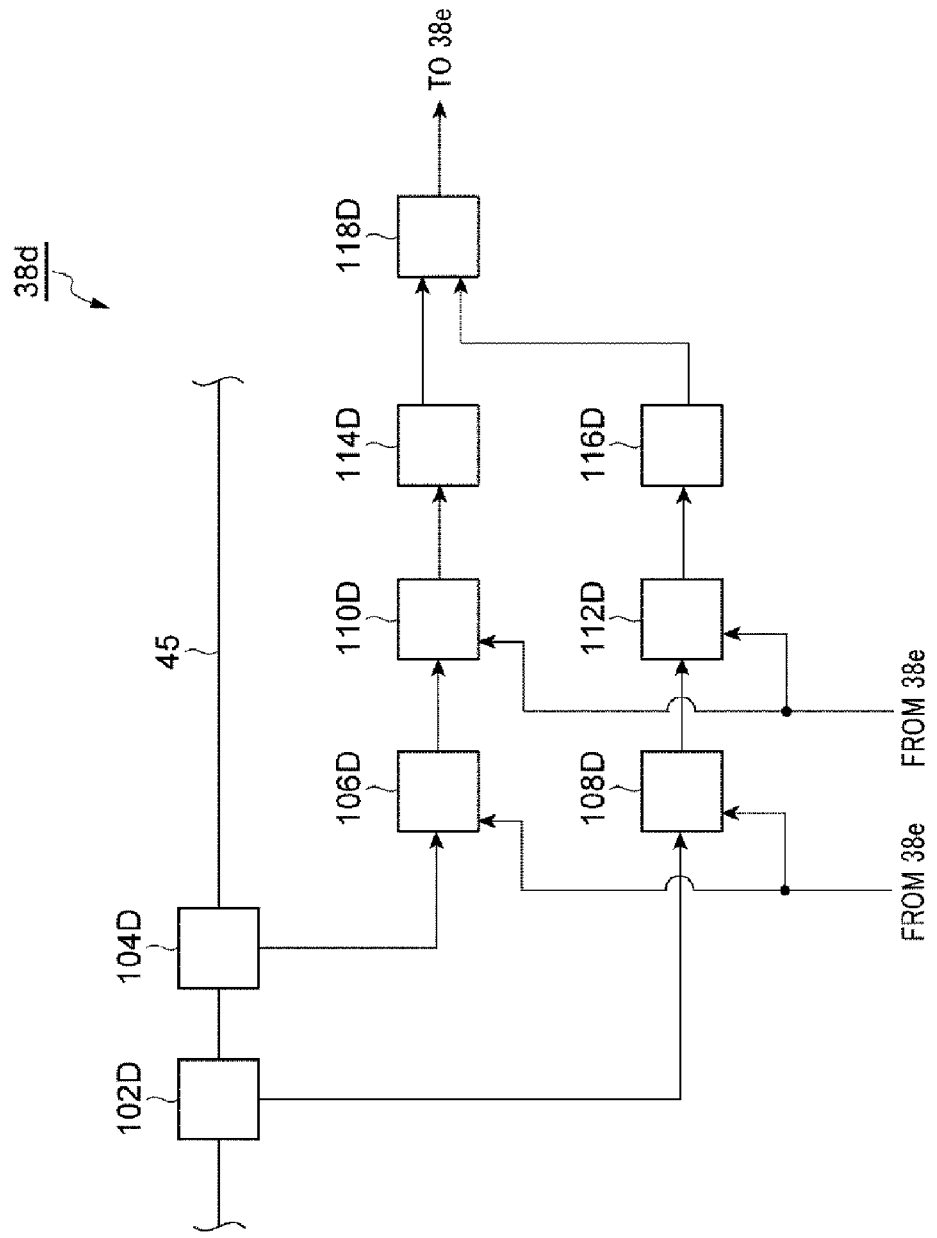
FIG. 11 is a diagram illustrating a configuration of an impedance sensor of the second high frequency power supply shown in FIG. 10.

Now, another exemplary embodiment will be explained. In a method MT according to another exemplary embodiment, the frequencies of the high frequency powers RF1 and RF2 are adjusted individually at least in the second process S2. Further, in still another exemplary embodiment, the powers of the high frequency powers RF1 and RF2 are also adjusted in addition to their frequencies at least in the second process S2. Below, referring to FIG. 8 to FIG. 11, a high frequency power supply 36A, a matching device 40A, a high frequency power supply 38A and a matching device 42A provided in the plasma processing apparatus 1 instead of the high frequency power supply 36, the matching device 40, the high frequency power supply 38 and the matching device 42 will be explained. FIG. 8 is a diagram illustrating a configuration of the high frequency power supply 36A and the matching device 40A. FIG. 9 is a diagram illustrating a configuration of an impedance sensor of the high frequency power supply 36A. FIG. 10 is a diagram illustrating a configuration of the high frequency power supply 38A and the matching device 42A. FIG. 11 is a diagram illustrating a configuration of an impedance sensor of the high frequency power supply 38A.

As depicted in FIG. 8, the high frequency power supply 36A includes, like the high frequency power supply 36, an oscillator 36a, a power amplifier 36b, a power sensor 36c and a power supply controller 36e. The high frequency power supply 36A further includes an impedance sensor 36d. Below, regarding the individual components of the high frequency power supply 36A, distinctive features from the corresponding components of the high frequency power supply 36 will be described. Further, the impedance sensor 36d will also be explained.

The power supply controller 36e of the high frequency power supply 36A is configured to apply, to the oscillator 36a, a frequency control signal for setting the frequency of the high frequency power RF1 in each of a first sub-period Ts1 and a second sub-period Ts2 within a processing time of the second process S2. To elaborate, the power supply controller 36e receives, from the impedance sensor 36d, a moving average value Imp11 of the load impedance of the high frequency power supply 36A in the past first sub-periods Ts1 and a moving average value Imp12 of the load impedance of the high frequency power supply 36A in the past second sub-periods Ts2. If the moving average value Imp11 and the moving average value Imp12 are within a preset control range, the power supply controller 36e sends, to the oscillator 36a, the frequency control signal for setting the frequency of the high frequency power RF1 for each of the first sub-period Ts1 and the second sub-period Ts2 in order to allow the load impedance of the high frequency power supply 36A in the first sub-period Ts1 estimated from the moving average value Imp11 and the load impedance of the high frequency power supply 36A in the second sub-period Ts2 estimated from the moving average value Imp12 to approximate to the matching point. The oscillator 36a sets the frequency of the high frequency power for the first sub-period Ts1 and the frequency of the high frequency power for the second sub-period Ts2 according to the corresponding frequency control signal. Meanwhile, if the moving average value Imp11 or the moving average value Imp12 does not fall within the preset control range, the power supply controller 36e sends, to the matching device 40A, a control signal in order to allow the matching device 40A to perform the impedance matching of the high frequency power supply 36A. Here, the allowing of the load impedance to approximate to the matching point ideally implies making the load impedance coincident with the matching point. Further, the "preset control range" refers to a range in which the load impedance of the high frequency power supply 36A can be matched with the matching point or an output impedance of the high frequency power supply 36A through the control of the frequency of the high frequency power RF1.

The power amplifier 36b generates the high frequency power RF1 by amplifying the high frequency power output from the oscillator 36a, and then, outputs the corresponding high frequency power RF1. This power amplifier 36b is controlled by the power supply controller 36e. To be specific, the power supply controller 36e controls the power amplifier 36b to output the high frequency power RF1 having a power level designated by the main controller 72.

In the present exemplary embodiment, the power supply controller 36e may control the power amplifier 36b such that the power of the high frequency power RF1 in the first sub-period Ts1 is higher than the power of the high frequency power RF1 in the second sub-period Ts2. By way of example, the power of the high frequency power RF1 in the first sub-period Ts1 may be set, based on the reflection wave power measurement value PR11 in the first sub-period Ts1 or the moving average value of reflection wave power measurement values PR11 in a preset number of first sub-periods Ts1, such that the power of the high frequency power RF1 combined to the plasma reaches a preset power level. Further, the power of the high frequency power RF1 in the second sub-period Ts2 may be set, based on the reflection wave power measurement value PR11 in the second sub-period Ts2 or the moving average value of reflection wave power measurement values PR11 in a preset number of second sub-periods Ts2, such that the power of the high frequency power RF1 combined to the plasma reaches a preset power level.

The impedance sensor 36d calculates the moving average value Imp11 of the load impedance of the high frequency power supply 36A in the first sub-periods Ts1 within the processing times of the completed second processes S2. Further, the impedance sensor 36d also calculates the moving average value Imp12 of the load impedance of the high frequency power supply 36A in the second sub-periods Ts2 within the processing times of the completed second processes S2. As depicted in FIG. 2, within the processing time of each second process S2, the first sub-period Ts1 is a period ranging from a start time point of the supply of the high frequency power RF2 to a certain time within the corresponding processing time. Further, within the processing time of each second process S2, the second sub-period Ts2 is a period ranging from the certain time within the processing time to an end time point of the corresponding processing time. In addition, a period including the first sub-period Ts1 and the second sub-period Ts2 within the processing time of each second process S2 is referred to as a period T1.

A time length of the first sub-period Ts1 and a time length of the second sub-period Ts2 are set by the power supply controller 36e. By way of example, the time length of the first sub-period Ts1 may be a preset time length stored in the power supply controller 36e, and the time length of the second sub-period Ts2 may be a predetermined time length stored in the power supply controller 36e. Alternatively, based on time series of the aforementioned reflection wave power measurement value PR11, the power supply controller 36e may set, as the second sub-period Ts2, a period in which the reflection wave power measurement value PR11 is stabilized equal to or below a preset value within the period T1. In such a case, a period prior to this second sub-period Ts2 within the period T1 may be set as the first sub-period Ts1.

As illustrated in FIG. 9, the impedance sensor 36d includes a current detector 102C, a voltage detector 104C, a filter 106C, a filter 108C, an average value calculator 110C, an average value calculator 112C, a moving average value calculator 114C, a moving average value calculator 116C and an impedance calculator 118C.

The voltage detector 104C is configured to detect a voltage waveform of the high frequency power RF1 transmitted on the power feed line 43 and is configured to output a voltage waveform analog signal indicating the corresponding voltage waveform. This voltage waveform analog signal is input to the filter 106C. The filter 106C is configured to generate a voltage waveform digital signal by digitizing the voltage waveform analog signal input thereto. Further, the filter 106C receives, from the power supply controller 36e, the signal specifying the frequency of the high frequency power RF1 for each of the first sub-period Ts1 and the second sub-period Ts2, and then, generates a filtered voltage waveform signal by extracting, from the voltage waveform digital signal, only the component corresponding to the frequency specified by this signal. Further, the filter 106C may be composed of, by way of non-limiting example, a FPGA (Field Programmable Gate Array).

The filtered voltage waveform signal generated by the filter 106C is output to the average value calculator 110C. The average value calculator 110C receives, from the power supply controller 36e, a sub-period specifying signal specifying the first sub-period Ts1 and the second sub-period Ts2. The average value calculator 110C calculates, from the filtered voltage waveform signal, an average value VA11 of the voltages in the first sub-period Ts1 within each period T1 specified by using the sub-period specifying signal. Further, the average value calculator 110C also calculates, from the filtered voltage waveform signal, an average value VA12 of the voltages in the second sub-period Ts2 within each period T1 specified by using the sub-period specifying signal. Furthermore, the average value calculator 110C may be composed of, by way of non-limiting example, a FPGA (Field Programmable Gate Array).

The average value VA11 and the average value VA12 obtained by the average value calculator 110C are output to the moving average value calculator 114C. The moving average value calculator 114C calculates a moving average value (moving average value VMA11) of a preset number of average values VA11 which are obtained for the first sub-periods Ts1 of a preset number of recently performed second processes S2 among the average values VA11 previously obtained for the completed second processes S2. Further, the moving average value calculator 114C also calculates a moving average value (moving average value VMA12) of the preset number of average values VA12 which are obtained for the second sub-periods Ts2 of the preset number of recently performed second processes S2 among the average values VA12 previously obtained for the completed second processes S2. The moving average values VMA11 and VMA12 obtained by the moving average value calculator 114C are output to the impedance calculator 118C. Further, the moving average value calculator 114C may be composed of, by way of non-limiting example, a CPU or a FPGA (Field Programmable Gate Array).

The current detector 102C is configured to detect a current waveform of the high frequency power RF1 transmitted on the power feed line 43 and is configured to output a current waveform analog signal indicating the corresponding current waveform. This current waveform analog signal is input to the filter 108C. Further, the filter 108C is configured to generate a current waveform digital signal by digitizing the current waveform analog signal input thereto. Further, the filter 108C receives, from the power supply controller 36e, the signal specifying the frequency of the high frequency power RF1 for each of the first sub-period Ts1 and the second sub-period Ts2, and then, generates a filtered current waveform signal by extracting, from the current waveform digital signal, only the component corresponding to the frequency specified by this signal. Further, the filter 108C may be composed of, by way of non-limiting example, a FPGA (Field Programmable Gate Array).

The filtered current waveform signal generated by the filter 108C is output to the average value calculator 112C. The average value calculator 112C receives, from the power supply controller 36e, the aforementioned sub-period specifying signal. The average value calculator 112C calculates, from the filtered current waveform signal, an average value IA11 of the electric currents in the first sub-period Ts1 within each period T1 specified by using the sub-period specifying signal. Further, the average value calculator 112C also calculates, from the filtered current waveform signal, an average value IA12 of the electric currents in the second sub-period Ts2 within each period T1 specified by using the sub-period specifying signal. Furthermore, the average value calculator 112C may be composed of, by way of non-limiting example, a FPGA (Field Programmable Gate Array).

The average value IA11 and the average value IA12 obtained by the average value calculator 112C are output to the moving average value calculator 116C. The moving average value calculator 116C calculates a moving average value (moving average value IMA11) of a preset number of average values IA11 which are obtained for the first sub-periods Ts1 of a preset number of recently performed second processes S2 among the average values IA11 previously obtained for the completed second processes S2. Further, the moving average value calculator 116C also calculates a moving average value (moving average value IMA12) of the preset number of average values IA12 which are obtained for the second sub-periods Ts2 of the preset number of recently performed second processes S2 among the average values IA12 previously obtained for the completed second processes S2. The moving average values IMA11 and IMA12 obtained by the moving average value calculator 116C are output to the impedance calculator 118C. Further, the moving average value calculator 116C may be composed of, by way of non-limiting example, a CPU or a FPGA (Field Programmable Gate Array).

The impedance calculator 118C calculates the moving average value Imp11 of the load impedance of the high frequency power supply 36A from the moving average value IMA11 and the moving average value VMA11. This moving average value Imp11 includes an absolute value and a phase component. Further, the impedance calculator 118C also calculates the moving average value Imp12 of the load impedance of the high frequency power supply 36A from the moving average value IMA12 and the moving average value VMA12. This moving average value Imp12 includes an absolute value and a phase component. The moving average values Imp11 and Imp12 obtained by the impedance calculator 118C are output to the power supply controller 36e. The moving average values Imp11 and Imp12 are used to set the frequency of the high frequency power RF1 in the power supply controller 36e, as stated above.

Referring back to FIG. 8, the matching device 40A includes, like the matching device 40, a matching circuit 40a, a sensor 40b, a controller 40c and actuators 40d and 40e. Below, regarding the individual components of the matching device 40A, distinctive features from the corresponding components of the matching device 40 will be discussed.

Like the impedance sensor 36d, the sensor 40b of the matching device 40A receives, from the power supply controller 36e, the signal specifying the frequency of the high frequency power RF1 for each of the first sub-period Ts1 and the second sub-period Ts2, and then, generates a filtered voltage waveform signal by extracting, from the voltage waveform digital signal, only the component corresponding to the frequency specified by this signal. Further, the sensor 40b outputs the filtered voltage waveform signal to the controller 40c. Furthermore, like the impedance sensor 36d, the sensor 40b of the matching device 40A receives, from the power supply controller 36e, the signal specifying the frequency of the high frequency power RF1 for each of the first sub-period Ts1 and the second sub-period Ts2, and then, generates a filtered current waveform signal by extracting, from the current waveform digital signal, only the component corresponding to the frequency specified by this signal. The sensor 40b outputs this filtered current waveform signal to the controller 40c.

If the moving average value Imp11 or the moving average value Imp12 does not fall within the preset control range, in response to the aforementioned control signal which is sent from the power supply controller 36e, the controller 40c of the matching device 40A controls the actuators 40d and 40e such that the load impedance of the high frequency power supply 36A specified by an average value of the moving average value Imp21 and the moving average value Imp22 becomes approximate to the matching point. Alternatively, if the moving average value Imp11 or the moving average value Imp12 does not fall within the preset control range, in response to the aforementioned control signal which is sent from the power supply controller 36e, the controller 40c of the matching device 40A controls the actuators 40d and 40e such that the load impedance of the high frequency power supply 36A specified by the moving average value Imp22 approximates to the matching point.

Now, reference is made to FIG. 10. As depicted in FIG. 10, the high frequency power supply 38A includes, like the high frequency power supply 38, an oscillator 38a, a power amplifier 38b, a power sensor 38c and a power supply controller 38e. The high frequency power supply 38A further includes an impedance sensor 38d. Below, regarding the individual components of the high frequency power supply 38A, distinctive features from the corresponding components of the high frequency power supply 38 will be described. Further, the impedance sensor 38d will also be explained.

The power supply controller 38e of the high frequency power supply 38A is configured to apply, to the oscillator 38a, a frequency control signal for setting the frequency of the high frequency power RF2 in each of the first sub-period Ts1 and the second sub-period Ts2. To elaborate, the power supply controller 38e receives, from the impedance sensor 38d, a moving average value Imp21 of the load impedance in the past first sub-periods Ts1 and a moving average value Imp22 of the load impedance in the past second sub-periods Ts2. If the moving average value Imp21 and the moving average value Imp22 are within a preset control range, the power supply controller 38e sends, to the oscillator 38a, the frequency control signal for setting the frequency of the high frequency power RF2 for each of the first sub-period Ts1 and the second sub-period Ts2 in order to allow the load impedance of the high frequency power supply 38A in the first sub-period Ts1 estimated from the moving average value Imp21 and the load impedance of the high frequency power supply 38A in the second sub-period Ts2 estimated from the moving average value Imp22 to approximate to the matching point. The oscillator 38a sets the frequency of the high frequency power for the first sub-period Ts1 and the frequency of the high frequency power for the second sub-period Ts2 according to the corresponding frequency control signal. Meanwhile, if the moving average value Imp21 or the moving average value Imp22 does not fall within the preset control range, the power supply controller 38e sends a control signal to the matching device 42A to allow the matching device 42A to perform the impedance matching of the high frequency power supply 38A. Here, the "preset control range" refers to a range in which the load impedance of the high frequency power supply 38A can be matched with the matching point or an output impedance of the high frequency power supply 38A through the control of the frequency of the high frequency power RF2.

The power amplifier 38b generates the high frequency power RF2 by amplifying the high frequency power output from the oscillator 38a, and then, outputs the corresponding high frequency power RF2. This power amplifier 38b is controlled by the power supply controller 38e. To be specific, the power supply controller 38e controls the power amplifier 38b to output the high frequency power RF2 having a power level designated by the main controller 72.

In the present exemplary embodiment, the power supply controller 38e may control the power amplifier 38b such that the power of the high frequency power RF2 in the first sub-period Ts1 is higher than the power of the high frequency power RF2 in the second sub-period Ts2. By way of example, the power of the high frequency power RF2 in the first sub-period Ts1 may be set, based on the reflection wave power measurement value PR21 in the first sub-period Ts1 or the moving average value of reflection wave power measurement values PR21 in a preset number of first sub-periods Ts1, such that the power of the high frequency power RF2 combined to the plasma reaches a preset power level. Further, the power of the high frequency power RF2 in the second sub-period Ts2 may be set, based on the reflection wave power measurement value PR21 in the second sub-period Ts2 or the moving average value of reflection wave power measurement values PR21 in a preset number of second sub-periods Ts2, such that the power of the high frequency power RF2 combined to the plasma reaches a preset power level. Further, in each of the second processes S2, the high frequency power RF2 having the frequency and the power set for the second sub-period Ts2 may maintain its set frequency and power until the supply of the corresponding high frequency power RF2 is stopped.

The impedance sensor 38d calculates the moving average value Imp21 of the load impedance of the high frequency power supply 38A in the first sub-periods Ts1 within the processing times of the completed second processes S2. Further, the impedance sensor 38d also calculates the moving average value Imp22 of the load impedance of the high frequency power supply 38A in the second sub-periods Ts2 within the processing times of the completed second processes S2. Further, like the power supply controller 36e, the power supply controller 38e may store therein a preset time length of the first sub-period Ts1 and a predetermined time length of the second sub-period Ts2. Alternatively, based on the time series of the aforementioned reflection wave power measurement value PR21, like the power supply controller 36e, the power supply controller 38e may set, as the second sub-period Ts2, a period in which the reflection wave power measurement value PR21 is stabilized equal to or below a preset value within the period T1. In such a case, a period prior to this second sub-period Ts2 within the period T1 may be set as the first sub-period Ts1.

As illustrated in FIG. 11, the impedance sensor 38d includes a current detector 102D, a voltage detector 104D, a filter 106D, a filter 108D, an average value calculator 110D, an average value calculator 112D, a moving average value calculator 114D, a moving average value calculator 116D and an impedance calculator 118D.

The voltage detector 104D is configured to detect a voltage waveform of the high frequency power RF2 transmitted on the power feed line 45 and is configured to output a voltage waveform analog signal indicating the corresponding voltage waveform. This voltage waveform analog signal is input to the filter 106D. The filter 106D is configured to generate a voltage waveform digital signal by digitizing the voltage waveform analog signal input thereto. Further, the filter 106D receives, from the power supply controller 38e, the signal specifying the frequency of the high frequency power RF2 for each of the first sub-period Ts1 and the second sub-period Ts2, and then, generates a filtered voltage waveform signal by extracting, from the voltage waveform digital signal, only the component corresponding to the frequency specified by this signal. Further, the filter 106D may be composed of, by way of non-limiting example, a FPGA (Field Programmable Gate Array).

The filtered voltage waveform signal generated by the filter 106D is output to the average value calculator 110D. The average value calculator 110D receives, from the power supply controller 38e, a sub-period specifying signal specifying the first sub-period Ts1 and the second sub-period Ts2. The average value calculator 110D calculates, from the filtered voltage waveform signal, an average value VA21 of the voltages in the first sub-period Ts1 within each period T1 specified by using the sub-period specifying signal. Further, the average value calculator 110D also calculates, from the filtered voltage waveform signal, an average value VA22 of the voltages in the second sub-period Ts2 within each period T1 specified by using the sub-period specifying signal. Furthermore, the average value calculator 110D may be composed of, by way of non-limiting example, a FPGA (Field Programmable Gate Array).

The average value VA21 and the average value VA22 obtained by the average value calculator 110D are output to the moving average value calculator 114D. The moving average value calculator 114D calculates a moving average value (moving average value VMA21) of a preset number of average values VA21 which are obtained for first sub-periods Ts1 of a preset number of recently performed second processes S2 among the average values VA21 previously obtained for the completed second processes S2. Further, the moving average value calculator 114D also calculates a moving average value (moving average value VMA22) of the preset number of average values VA22 which are obtained for second sub-periods Ts2 of the preset number of recently performed second processes S2 among the average values VA22 previously obtained for the completed second processes S2. The moving average values VMA21 and VMA22 obtained by the moving average value calculator 114D are output to the impedance calculator 118D. Further, the moving average value calculator 114D may be composed of, by way of non-limiting example, a CPU or a FPGA (Field Programmable Gate Array).

The current detector 102D is configured to detect a current waveform of the high frequency power RF2 transmitted on the power feed line 45, and is configured to output a current waveform analog signal indicating the corresponding current waveform. This current waveform analog signal is input to the filter 108D. Further, the filter 108D generates a current waveform digital signal by digitizing the current waveform analog signal input thereto. Further, the filter 108D receives, from the power supply controller 38e, the signal specifying the frequency of the high frequency power RF2 for each of the first sub-period Ts1 and the second sub-period Ts2, and then, generates a filtered current waveform signal by extracting, from the current waveform digital signal, only the component corresponding to the frequency specified by this signal. Further, the filter 108D may be composed of, by way of non-limiting example, a FPGA (Field Programmable Gate Array).

The filtered current waveform signal generated by the filter 108D is output to the average value calculator 112D. The average value calculator 112D receives, from the power supply controller 38e, the aforementioned sub-period specifying signal. The average value calculator 112D calculates, from the filtered current waveform signal, an average value IA21 of the electric currents in the first sub-period Ts1 within each period T1 specified by using the sub-period specifying signal. Further, the average value calculator 112D also calculates, from the filtered current waveform signal, an average value IA22 of the electric currents in the second sub-period Ts2 within each period T1 specified by using the sub-period specifying signal. Furthermore, the average value calculator 112D may be composed of, by way of non-limiting example, a FPGA (Field Programmable Gate Array).

The average value IA21 and the average value IA22 obtained by the average value calculator 112D are output to the moving average value calculator 116D. The moving average value calculator 116D calculates a moving average value (moving average value IMA21) of a preset number of average values IA21 which are obtained for the first sub-periods Ts1 of the preset number of recently performed second processes S2 among the average values IA21 previously obtained for the completed second processes S2. Further, the moving average value calculator 116D also calculates a moving average value (moving average value IMA22) of the preset number of average values IA22 which are obtained for the second sub-periods Ts2 of the preset number of recently performed second processes S2 among the average values IA22 previously obtained for the completed second processes S2. The moving average values IMA21 and IMA22 obtained by the moving average value calculator 116D are output to the impedance calculator 118D. Further, the moving average value calculator 116D may be composed of, by way of non-limiting example, a CPU or a FPGA (Field Programmable Gate Array).

The impedance calculator 118D calculates the moving average value Imp21 of the load impedance of the high frequency power supply 38A from the moving average value IMA21 and the moving average value VMA21. This moving average value Imp21 includes an absolute value and a phase component. Further, the impedance calculator 118D also calculates the moving average value Imp22 of the load impedance of the high frequency power supply 38A from the moving average value IMA22 and the moving average value VMA22. This moving average value Imp22 includes an absolute value and a phase component. The moving average values Imp21 and Imp22 obtained by the impedance calculator 118D are output to the power supply controller 38e.

The moving average values Imp21 and Imp22 are used to set the frequency of the high frequency power RF2 in the power supply controller 38e, as stated above.

Referring back to FIG. 10, the matching device 42A includes, like the matching device 42, a matching circuit 42a, a sensor 42b, a controller 42c and actuators 42d and 42e. Below, regarding the individual components of the matching device 42A, distinctive features from the corresponding components of the matching device 42 will be discussed.

Like the impedance sensor 38d, the sensor 42b of the matching device 42A receives, from the power supply controller 38e, the signal specifying the frequency of the high frequency power RF2 for each of the first sub-period Ts1 and the second sub-period Ts2, and then, generates a filtered voltage waveform signal by extracting, from the voltage waveform digital signal, only the component corresponding to the frequency specified by this signal. Further, the sensor 42b outputs the filtered voltage waveform signal to the controller 42c. Furthermore, like the impedance sensor 38d, the sensor 42b of the matching device 42A receives, from the power supply controller 38e, the signal specifying the frequency of the high frequency power RF2 for each of the first sub-period Ts1 and the second sub-period Ts2, and then, generates a filtered current waveform signal by extracting, from the current waveform digital signal, only the component corresponding to the frequency specified by this signal. The sensor 42b outputs this filtered current waveform signal to the controller 42c.

If the moving average value Imp21 or the moving average value Imp22 does not fall within the preset control range, in response to the aforementioned control signal which is sent from the power supply controller 38e, the controller 42c of the matching device 42A controls the actuators 42d and 42e such that the load impedance of the high frequency power supply 38A specified by an average value of the moving average value Imp21 and the moving average value Imp22 becomes approximate to the matching point. Alternatively, if the moving average value Imp21 or the moving average value Imp22 does not fall within the preset control range, in response to the aforementioned control signal which is sent from the power supply controller 38e, the controller 42c of the matching device 42A controls the actuators 42d and 42e such that the load impedance of the high frequency power supply 38A specified by the moving average value Imp22 approximates to the matching point.

Now, a method of the impedance matching performed in the plasma processing apparatus 1 equipped with the high frequency power supply 36A, the matching device 40A, the high frequency power supply 38A and the matching device 42A described in FIG. 8 to FIG. 11 will be explained. Further, FIG. 12 is a flowchart for describing a method of the impedance matching performed in a plasma processing method according to another exemplary embodiment.

Figure 12:
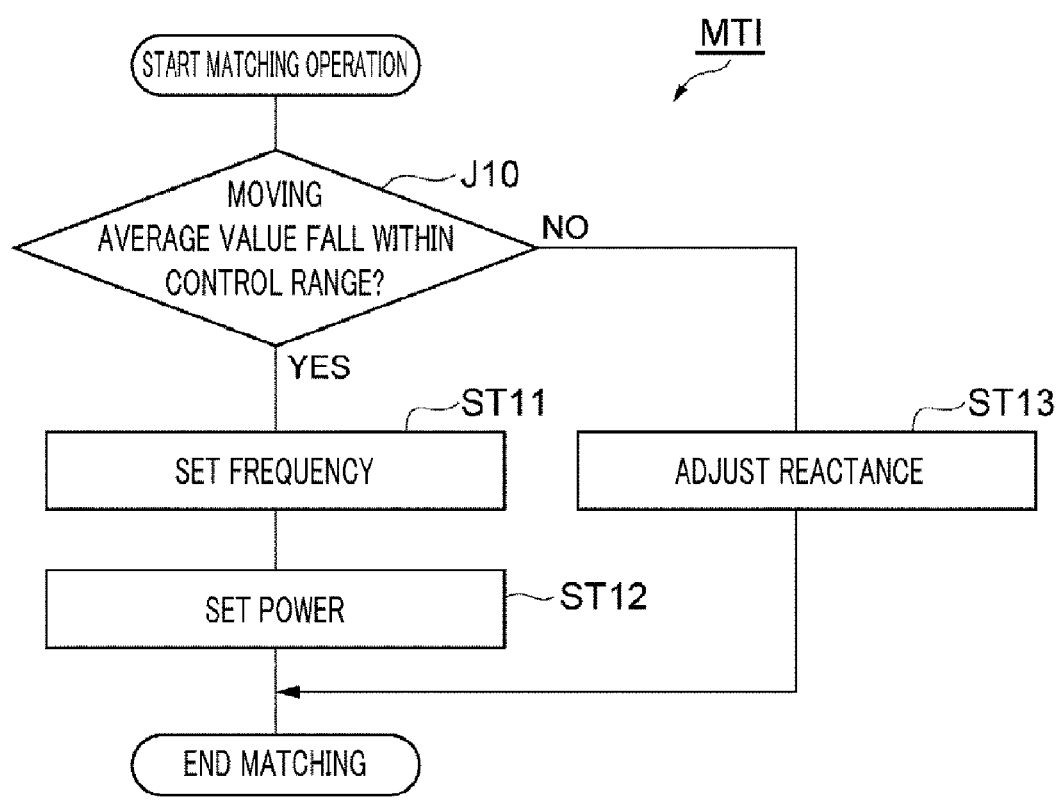
FIG. 12 is a flowchart for describing a method of impedance matching performed in a plasma processing method according to another exemplary embodiment.

The method MTI of the impedance matching shown in FIG. 12 is used in the second process S2 in the method MT. In a process other than the second process S2, the above-described impedance matching for the matching device 40 and the matching device 42 may be performed.

In initially performing the method MT, the second process S2 is not performed a sufficient number of times to calculate the moving average value Imp11, the moving average value Imp12, the moving average value Imp21 and the moving average value Imp22. Thus, in initially performing the method MT, only the calculation of the average value VA11, the average value IA11, the average value VA12, the average value IA12, the average value VA21, the average value IA21, the average value VA22 and the average value IA22 and the accumulation thereof are performed.

After the second process S2 is performed a sufficient number of times to calculate the moving average value Imp11, the moving average value Imp12, the moving average value Imp21 and the moving average value Imp22, the moving average value Imp11 and the moving average value Imp12 are obtained in the impedance sensor 36d, and the moving average value Imp21 and the moving average value Imp22 are obtained in the impedance sensor 38d.

After the moving average value Imp11, the moving average value Imp12, the moving average value Imp21 and the moving average value Imp22 are obtained, a determination step J10 is performed in each of the second processes S2, as shown in FIG. 12. In the determination step J10, it is determined by the power supply controller 36e whether the moving average value Imp11 and the moving average value Imp12 are within the aforementioned preset control range. Further, it is also determined by the power supply controller 38e whether the moving average value Imp21 and the moving average value Imp22 fall within the aforementioned preset control range.

If it is determined that the moving average value Imp11 and the moving average value Imp12 are found to be within the aforementioned preset control range, the power supply controller 36e sets, in a step ST11, the frequency of the high frequency power RF1 for the first sub-period Ts1 and sets the frequency of the high frequency power RF1 for the second sub-period Ts2, as stated above. In a subsequent step ST12, the power supply controller 36e sets the power of the high frequency power RF1 for the first sub-period Ts1, and sets the power of the high frequency power RF1 for the second sub-period Ts2, as stated above. Further, if it is found out that the moving average value Imp21 and the moving average value Imp22 are within the aforementioned preset control range, the power supply controller 38e sets, in the step ST11, the frequency of the high frequency power RF2 for the first sub-period Ts1, and sets the frequency of the high frequency power RF2 for the second sub-period Ts2, as stated above. Then, in the subsequent step ST12, the power supply controller 38e sets the power of the high frequency power RF2 for the first sub-period Ts1, and sets the power of the high frequency power RF2 for the second sub-period Ts2, as stated above.

Meanwhile, if it is determined that the moving average value Imp11 or the moving average value Imp12 does not fall within the aforementioned preset control range, a control signal is sent from the power supply controller 36e to the matching device 40A in a step ST13 to allow the matching device 40A to perform the impedance matching of the high frequency power supply 36A. In response to this control signal, the controller 40c of the matching device 40A controls the actuators 40d and 40e such that the load impedance of the high frequency power supply 36A approximates to the matching point, as stated above. Further, if it is found out that the moving average value Imp21 or the moving average value Imp22 does not fall within the aforementioned preset control range, a control signal is sent from the power supply controller 38e to the matching device 42A in the step ST13 to allow the matching device 42A to perform the impedance matching of the high frequency power supply 38A. In response to this control signal, the controller 42c of the matching device 42A controls the actuators 42d and 42e such that the load impedance of the high frequency power supply 38A approximates to the matching point, as stated above.

Since the first sub-period Ts1 in the second process S2 is a period including a time point when the supply of the high frequency power RF2 is begun, the reflection wave on the power feed line 43 may be increased than the reflection wave in the second sub-period Ts2, which is caused by the variation of the load impedance of the high frequency power supply 36A. This is the same for the high frequency power RF2. Thus, in order to reduce the reflection wave of the high frequency power RF1, it is required to match the load impedance of the high frequency power supply 36A in each of the first sub-period Ts1 and the second sub-period Ts2 individually with the output impedance of the high frequency power supply 36A. Further, in order to reduce the reflection wave of the high frequency power RF2, it is required to match the load impedance of the high frequency power supply 38A in each of the first sub-period Ts1 and the second sub-period Ts2 individually with the output impedance of the high frequency power supply 38A. According to the method MTI of the impedance matching shown in FIG. 12, the frequency of the high frequency power RF1 is adjusted such that the load impedance of the high frequency power supply 36A estimated from the moving average value (moving average value Imp11) (i.e., a first moving average value) of the load impedance of the high frequency power supply 36A in the first sub-periods Ts1 of the completed second processes S2 approximates to the output impedance of the high frequency power supply 36A. Further, the frequency of the high frequency power RF1 in the second sub-period Ts2 is adjusted in the same manner based on the moving average value Imp12, i.e., a second moving average value. Furthermore, the frequency of the high frequency power RF2 in the first sub-period Ts1 is adjusted in the same manner based on the moving average value Imp21, i.e., a third moving average value. In addition, the frequency of the high frequency power RF2 in the second sub-period Ts2 is adjusted in the same manner based on the moving average value Imp22, i.e., a fourth moving average value. According to the method MTI, since the high frequency power supply 36A and the high frequency power supply 38A can change the frequencies of the high frequency powers at a high speed, it is possible to perform the impedance matching while keeping up with the variation of the load impedance at a high speed.

Further, through the step ST12, the power of the high frequency power RF1 can be additionally supplied when the power of the high frequency power RF1 combined to the plasma in the first sub-period Ts1 is not sufficient. Further, through the step ST12, the power of the high frequency power RF2 can also be additionally supplied when the power of the high frequency power RF2 combined to the plasma in the first sub-period Ts1 is not enough.

In the above, various exemplary embodiments have been described. However, the exemplary embodiments are not limiting, and various changes and modifications may be made. By way of example, the high frequency power supply 36 and the high frequency power supply 36A may be configured to supply the high frequency power RF1 to the upper electrode 46. Further, the plasma processing apparatus configured to perform the method MT is not limited to the capacitively coupled plasma processing apparatus. The method MT may also be applicable to any of various plasma processing apparatuses equipped with the first electrode and the second electrode, e.g., an inductively coupled plasma processing apparatus.

Further, in the above-described exemplary embodiments, the adjustment of the high frequency power RF1 (i.e., adjustment of the frequency and the power of the high frequency power RF1) and the adjustment of the high frequency power RF2 (i.e., adjustment of the frequency and the power of the high frequency power RF2) are performed in each of the first sub-period and the second sub-period of each process S2. Likewise, two sub-periods may also be set for each of the first process S1 and the third process S3, and the adjustment of the high frequency power RF1 (i.e., adjustment of the frequency and the power of the high frequency power RF1) may be performed in each of the two sub-periods. Still likewise, in the fourth process S4, two sub-periods may be set, and the adjustment of the high frequency power RF2 (i.e., adjustment of the frequency and the power of the high frequency power RF2) may be performed in each of the two sub-periods.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

I claim:

1. A plasma processing method performed in a plasma processing apparatus,
wherein the plasma processing apparatus comprises:
a processing vessel;
a gas supply system configured to supply a gas into the processing vessel;
a first electrode and a second electrode which are arranged such that a space within the processing vessel is provided therebetween;
a first high frequency power supply configured to output a first high frequency power for plasma generation;
a second high frequency power supply configured to output a second high frequency power for ion attraction;
a first power feed line configured to connect the first high frequency power supply to the first electrode or the second electrode;
a second power feed line configured to connect the second high frequency power supply to the second electrode;
a first matching device configured to adjust a load impedance of the first high frequency power supply;
a second matching device configured to adjust a load impedance of the second high frequency power supply;
a first device configured to control the gas supply system; and
a second device configured to obtain a parameter which includes at least one of the load impedance, a load resistance and a load reactance of the first high frequency power supply, and a reflection wave coefficient of the first high frequency power,
wherein the plasma processing method comprises:
first processes of generating plasma of a first gas within the processing vessel; and
second processes of generating plasma of a second gas which contains a gas different from a gas contained in the first gas within the processing vessel, the second processes being performed alternately with the first processes,
wherein, in each of the first processes, the first gas is supplied into the processing vessel from the gas supply system, and the first high frequency power is supplied to the first electrode or the second electrode from the first high frequency power supply,
in each of the second processes, the first high frequency power is supplied to the first electrode or the second electrode from the first high frequency power supply continuously from a first process, which is performed just before the corresponding second process, among the first processes, and each of the second processes comprises:

applying a gas switching signal to the gas supply system from the first device to switch a gas to be supplied into the processing vessel from the first gas to the second gas; and instructing, by the second device, the second high frequency power supply to start a supply of the second high frequency power to the second electrode when the parameter exceeds a threshold value after the gas switching signal is applied to the gas supply system.

2. The plasma processing method of claim 1, further comprising:

obtaining, by a third device of the plasma processing apparatus, a time difference between a time point when each of the second processes is begun and a time point when the supply of the second high frequency power in each of the second processes is begun; and adjusting a set processing time length of a subsequent second process, which is performed later than a completed second process, among the second processes, such that the set processing time length of the subsequent second process is increased by the time difference obtained for the completed second process among the second processes.

3. The plasma processing method of claim 1, further comprising:

adjusting, by the second device, the threshold value by using a moving average value calculated from series of the parameter, wherein the series of the parameter include a parameter including at least one of the load impedance, the load resistance and the load reactance of the first high frequency power supply and the reflection wave coefficient of the first high frequency power in a state that impedance matching by the first matching device is completed in the completed second process among the second processes, or in each of the completed second process and a second process being performed.

4. The plasma processing method of claim 1, further comprising:

controlling, by a power supply controller of the first high frequency power supply, the first high frequency power when a first moving average value and a second moving average value fall within a preset control range in each of the second processes, a frequency of the first high frequency power output in a first sub-period being adjusted such that the load impedance of the first high frequency power supply estimated from the first moving average value approximates to an output impedance of the first high frequency power supply, and the frequency of the first high frequency power output in a second sub-period being adjusted such that the load impedance of the first high frequency power supply estimated from the second moving average value approximates to the output impedance of the first high frequency power supply; and controlling, by a power supply controller of the second high frequency power supply, the second high frequency power when a third moving average value and a fourth moving average value fall within a predetermined control range in each of the second processes, a frequency of the second high frequency power output in the first sub-period being adjusted such that a load impedance of the second high frequency power supply estimated from the third moving average value approximates to an output impedance of the second high frequency power supply, and the frequency of the second high frequency power output in the second sub-period being adjusted such that the load impedance of the second high frequency power supply estimated from the fourth moving average value approximates to the output impedance of the second high frequency power supply, wherein the first sub-period is a period, within a processing time of each of the second processes, ranging from a time point when a supply of the second high frequency power is begun to a preset time point within the processing time, and the second sub-period is a period ranging from the preset time point to an end time point of the processing time, the first moving average value is a moving average value of the load impedance of the first high frequency power supply in the first sub-period, within each of the processing times of the completed second processes among the second processes, ranging from the time point when the supply of the second high frequency power is begun to the preset time point within the processing time, the second moving average value is a moving average value of the load impedance of the first high frequency power supply in the second sub-period, within each of the processing times of the completed second processes, ranging from the preset time point to the end time point of the processing time, the third moving average value is a moving average value of the load impedance of the second high frequency power supply in the first sub-period within each of the processing times of the completed second processes, and the fourth moving average value is a moving average value of the load impedance of the second high frequency power supply in the second sub-period within each of the processing times of the completed second processes.

5. The plasma processing method of claim 4, wherein, in the controlling of the first high frequency power, the power supply controller of the first high frequency power supply adjusts a power of the first high frequency power such that the power of the first high frequency power in the first sub-period is higher than that of the first high frequency power in the second sub-period, and in the controlling of the second high frequency power, the power supply controller of the second high frequency power supply adjusts a power of the second high frequency power such that the power of the second high frequency power in the first sub-period is higher than that of the second high frequency power in the second sub-period.

* * * * *

UNITED STATES PATENT AND TRADEMARK OFFICE
CERTIFICATE OF CORRECTION

PATENT NO. : 9,805,917 B2
APPLICATION NO. : 15/408733
DATED : October 31, 2017
INVENTOR(S) : Koichi Nagami Page 1 of 1

It is certified that error appears in the above-identified patent and that said Letters Patent is hereby corrected as shown below:

In the Specification

Column 14, Line 50, replace " $r1 = \frac{\sqrt{(Zr1-50)^2 + (Zi1)^2}}{(Zr1-50)^2 + (Zi1)^2}$ " with -- $r1 = \frac{\sqrt{(Zr1-50)^2 + (Zi1)^2}}{(Zr1-50)^2 + (Zi1)^2}$ --.

Column 17, Line 39, replace "1506" with -- 150B --.

Column 17, Line 41, replace "1506" with -- 150B --.

Signed and Sealed this
Twenty-fourth Day of April, 2018

Andrei Iancu
*Director of the United States Patent and Trademark Office*